US012749542B2

(12) United States Patent
Xiang et al.

(10) Patent No.: US 12,749,542 B2
(45) Date of Patent: Sep. 29, 2026

(54) OPERATION METHOD OF MEMORY, AND MEMORY, MEMORY SYSTEM, AND ELECTRONIC SYSTEM

(71) Applicant: YANGTZE MEMORY TECHNOLOGIES CO., LTD., Wuhan (CN)

(72) Inventors: Li Xiang, Wuhan (CN); Wei Huang, Wuhan (CN); Mehui Lai, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 54 days.

(21) Appl. No.: 18/753,557

(22) Filed: Jun. 25, 2024

(65) Prior Publication Data

US 2025/0292841 A1 Sep. 18, 2025

(30) Foreign Application Priority Data

Mar. 12, 2024 (CN) ......................... 202410284325.0

(51) Int. Cl.
*G11C 16/26* (2006.01)
*G11C 5/14* (2006.01)
*G11C 16/08* (2006.01)

(52) U.S. Cl.
CPC .............. *G11C 16/26* (2013.01); *G11C 5/145* (2013.01); *G11C 16/08* (2013.01)

(58) Field of Classification Search
CPC .......... G11C 16/26; G11C 5/145; G11C 16/08
See application file for complete search history.

(56) References Cited

U.S. PATENT DOCUMENTS 11,056,195 B1 7/2021 Liu et al.
2010/0027340 A1* 2/2010 Di Iorio .................. G11C 7/02 365/185.25
2013/0013870 A1* 1/2013 Cronie ................ G11C 11/5642 711/E12.001
2014/0146608 A1 5/2014 Jung
(Continued)

FOREIGN PATENT DOCUMENTS

CN 113994431 A 1/2022

OTHER PUBLICATIONS

Yangtze Memory Technologies Co., Ltd., "First Review Comments," dated Jul. 3, 2026, Chinese Patent App. No. 202410284325.0, 6 p. (plus 6 p. translation).

*Primary Examiner* — Han Yang
(74) *Attorney, Agent, or Firm* — Conley Rose, P.C.

(57) ABSTRACT

The present application discloses an operation method of a memory, and a memory, a memory system, and an electronic system. The method includes: acquiring a data output command; in response to the data output command, utilizing charge pump cells to boost voltages on all word lines corresponding to each of memory planes to pass voltages, wherein the number of the charge pump cells corresponding to the memory plane of which the data output sequence is the first is greater than or equal to the average number, and the total number of the charge pump cells is less than the total number of charge pump cells that have been configured in the memory; and one of the memory planes that has been pre-charged, reading data of the one of the memory planes, and outputting the data of the one of the memory planes according to the data output sequence.

20 Claims, 12 Drawing Sheets

(56) References Cited

U.S. PATENT DOCUMENTS

| | | | | |
|---|---|---|---|---|
| 2016/0188210 | A1* | 6/2016 | Tanzawa | G11C 7/00 365/230.01 |
| 2018/0203796 | A1 | 7/2018 | Park et al. | |
| 2018/0204620 | A1* | 7/2018 | Kim | G11C 16/20 |
| 2018/0226128 | A1 | 8/2018 | Park et al. | |

* cited by examiner

OPERATION METHOD OF MEMORY, AND MEMORY, MEMORY SYSTEM, AND ELECTRONIC SYSTEM

CROSS-REFERENCE TO RELATED APPLICATIONS

The present application claims priority to Chinese Patent Application No. 2024102843250, which was filed Mar. 12, 2024, is titled "OPERATING METHOD OF MEMORY, MEMORY, STORAGE SYSTEM AND ELECTRONIC SYSTEM," and is hereby incorporated herein by reference in its entirety.

TECHNICAL FIELD

Examples of the present application relate to the technical field of memory technology, and particularly to an operation method of a memory, and a memory, a memory system, and an electronic system.

BACKGROUND

With the development of the memory technology, the application of the memory is becoming more and more extensive, for example, the memory can be used in electronic devices such as mobile phones, computers, positioning devices, wearable devices, smart sensors, etc.

The memory comprises a plurality of memory planes and supports data output operations of the plurality of memory planes.

SUMMARY

Examples of the present application provide an operation method of a memory, and a memory, a memory system, and an electronic system. The technical solutions are as follows:

In an aspect, examples of the present application provide an operation method of a memory. The method comprises:

acquiring a data output command, wherein the data output command carries a data output sequence corresponding to each of a plurality of memory planes in a memory;

in response to the data output command, utilizing charge pump cells corresponding to each of the plurality of memory planes to boost voltages on all word lines corresponding to each of the plurality of memory planes to pass voltages, to complete pre-charging of the plurality of memory planes, wherein the number of the charge pump cells corresponding to the memory plane of which the data output sequence is the first is greater than an average number, or the number of the charge pump cells corresponding to the memory plane of which the data output sequence is the first is equal to the average number, and the total number of the charge pump cells corresponding to the plurality of memory planes is less than the total number of charge pump cells that have been configured in the memory; and for any one of the memory planes that has been pre-charged, reading data of the any one of the memory planes, and outputting the data of the any one of the memory planes according to the data output sequence corresponding to the any one of the memory planes, wherein, when the data output sequence corresponding to the any one of the memory planes is the first, read completion time corresponding to the any one of the memory planes is the same as output start time corresponding to the any one of the memory planes.

The examples of the present application further provide an operation method of a memory. The method comprises:

acquiring a data output command, wherein the data output command carries a data output sequence corresponding to each of a plurality of memory planes in a memory;

in response to the data output command, boosting voltages on all word lines corresponding to each of the plurality of memory planes to pass voltages in a voltage boosting rate corresponding to each of the plurality of memory planes, to complete pre-charging of the plurality of memory planes, wherein the voltage boosting rate corresponding to the memory plane of which the data output sequence is the first is greater than an average boosting rate, or the voltage boosting rate corresponding to the memory plane of which the data output sequence is the first is equal to the average number, and a sum of the voltage boosting rates corresponding to the plurality of memory planes is less than a total average boosting rate configured by the memory, and the voltage boosting rate is controlled by charge pump cells; and for any one of the memory planes that has been pre-charged, reading data of the any one of the memory planes, and outputting the data of the any one of the memory planes according to the data output sequence corresponding to the any one of the memory planes, wherein, when the data output sequence corresponding to the any one of the memory planes is the first, read completion time corresponding to the any one of the memory planes is the same as output start time corresponding to the any one of the memory planes.

In another aspect, examples of the present application provide a memory. The memory comprises:

a memory array comprising a plurality of memory planes;

a plurality of word lines coupled with memory cells in the plurality of memory planes; and a peripheral circuit coupled with the plurality of word lines, wherein the peripheral circuit is configured to perform the operation method of the memory described in any one of the above.

In another aspect, examples of the present application provide a memory system. The memory system comprises a memory and a controller coupled with the memory, wherein the controller is configured to control the memory;

the controller is configured to: acquire a data output command, and send the data output command to the memory, wherein the data output command carries a data output sequence corresponding to each of a plurality of memory planes in the memory;

the memory is configured to: perform the operation method of the memory described in any one of the above to output data of the any one of the memory planes to the controller; and the controller is configured to: receive the data of the any one of the memory planes.

In another aspect, examples of the present application provide an electronic system. The electronic system comprises a host and a memory system, wherein the memory system comprises a memory and a controller coupled with the memory; the controller is configured to control the memory; the host is provided with a first interface, and the controller is provided with a second interface; the host and the memory system are coupled through the first interface and the second interface to achieve information interaction;

the host is configured to: send data output command to the controller through the first interface, wherein the data output command carries a data output sequence corresponding to each of a plurality of memory planes in the memory;

the controller is configured to receive the data output command through the second interface, and send the data output command to the memory;

the memory is configured to: perform the operation method of the memory described in any one of the above to output data of the any one of the memory planes to the controller;

the controller is further configured to: receive the data of the any one of the memory planes, and output the data of the any one of the memory planes to the host through the second interface; and the host is configured to: receive the data of the any one of the memory planes through the first interface.

BRIEF DESCRIPTION OF THE DRAWINGS

In order to describe the technical solutions in examples of the present application more clearly, the drawings required to be used in the examples will be simply introduced below. It is apparent that the drawings in the following descriptions are only some examples of the present application. Those of ordinary skill in the art may further obtain other drawings according to these drawings without creative work.

DETAILED DESCRIPTION

Figure 1:
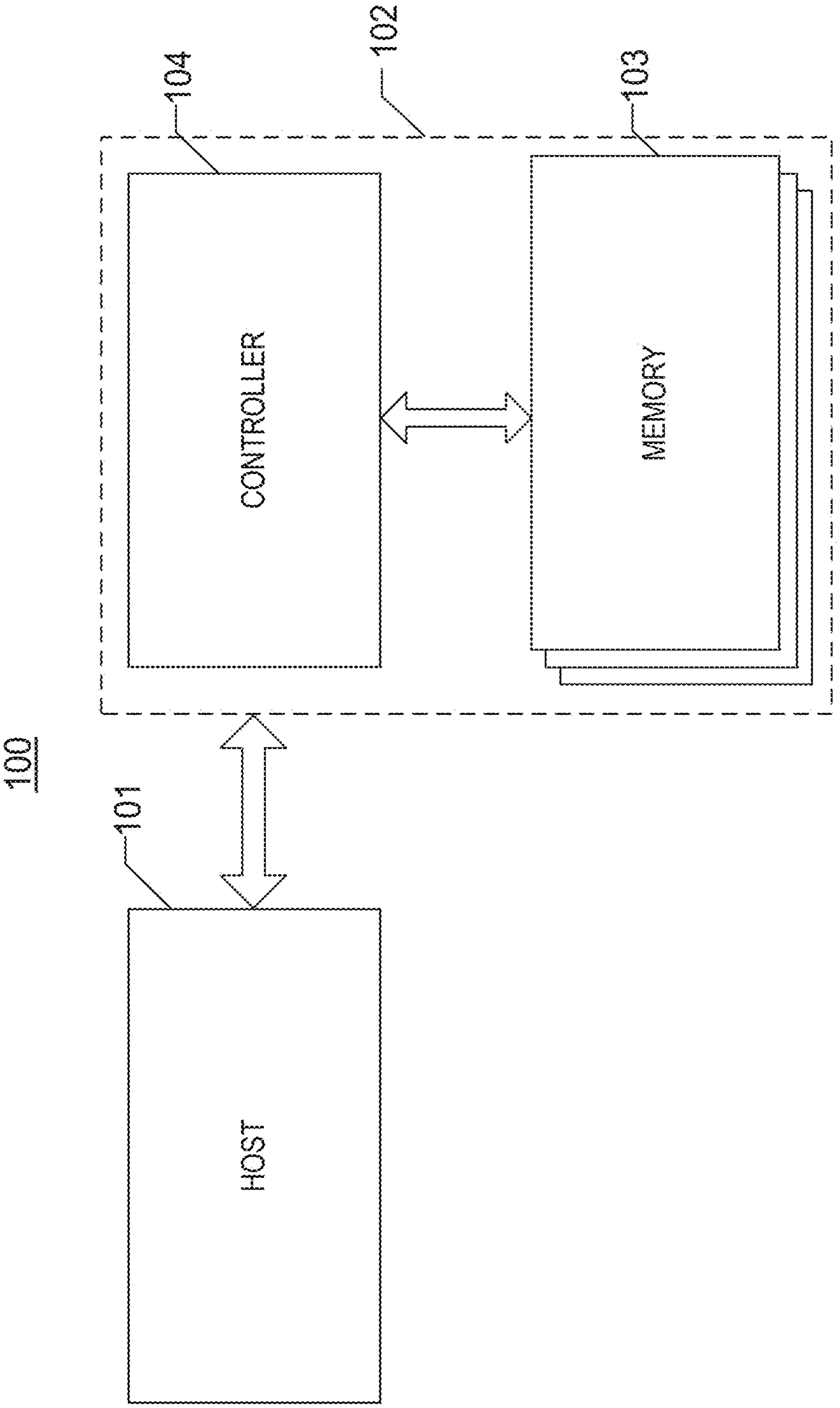
FIG. 1 is a schematic structural diagram of an electronic system provided by examples of the present application.

In order to make objectives, technical solutions, and advantages of the present application clearer, the examples of the present application will be described in detail below with reference to the drawings. Although examples of the present application are shown in the drawings, it is to be understood that the present application may be implemented in various ways without being limited by the examples as set forth herein. On the contrary, these examples are provided for more thorough understanding of the present application, and to fully convey the scope of the present application to those skilled in the art. All the drawings are in a very simple form and are on non-precise scales and are used only for the purpose of assisting in the illustration of examples of the present application in a convenient and clear manner.

It is to be noted that terms “first”, “second” and the like in the present application are used for distinguishing similar objects rather than describing a specific sequence or a precedence order. It should be understood that the data used in such a way may be exchanged where appropriate, in order that the examples of the present application described here can be implemented in an order other than those illustrated or described herein. The examples described in the following examples do not represent all examples consistent with the present application. On the contrary, the examples are merely examples consistent with some aspects of the present application.

It should be readily understood that the meaning of “on”, “above”, and “over” in the present application should be interpreted in the broadest manner such that “on” not only means “directly on” something but also includes the meaning of “on” something with an intermediate feature or a layer therebetween, and that “above” or “over” not only means the meaning of “above” or “over” something but can also include the meaning it is “above” or “over” something with no intermediate feature or layer therebetween (e.g., directly on something).

Furthermore, spatially relative terms such as “beneath,” “below,” “lower,” “above,” “upper” and the like, may be used herein for ease of description to describe the relationship between one element or feature and (one or more) another element or feature as shown in the figures. The spatially relative terms are intended to cover different orientations in the use or operation of the device other than those depicted in the figures. The device can be oriented in other ways (rotated 90 degrees or in other orientations) and the spatially relative descriptors used herein can be interpreted accordingly.

FIG. 1 shows a schematic structural diagram of an electronic system provided by examples of the present application. The electronic system 100 may comprise a mobile phone, a desktop computer, a laptop computer, a tablet computer, a vehicle computer, a gaming console, a printer, a positioning device, a wearable electronic device, a smart sensor, a virtual reality (VR) device, an augmented reality (AR) device, or any other suitable electronic devices having memory devices therein.

As shown in FIG. 1, the electronic system 100 comprises a host 101 and a memory system 102 coupled to the host 101. The host 101 may be a processor of an electronic device, such as a central processing unit (CPU), or a system on chip (SoC) (such as an application processor (AP). The host 101 may be configured to send data to the memory system 102. Alternatively, the host 101 may be configured to receive the data from the memory system 102.

The memory system 102 comprises one or more memories 103 and a controller 104. The controller 104 is coupled to the memory 103, and the controller 104 is configured to control the memory 103. The memory 103 may be any type of memory. In an example, the memory 103 is a Not AND (NAND) flash memory, such as a three-dimensional (3D) NAND flash memory. Alternatively, the memory 103 is a dynamic random access memory (DRAM), etc.

In an example, the controller 104 is further coupled to the host 101. The controller 104 may manage data stored in the memory 103 and communicate with the host 101.

In one possible example, the controller 104 is designed for operating in a low duty-cycle environment, such as secure digital (SD) cards, compact flash (CF) cards, universal serial bus (USB) flash drives, or other media for use in electronic devices, such as personal computers, digital cameras, mobile phones, etc.

In one possible example, the controller 104 is designed for operating in a high duty-cycle environment, for example, such as solid-state drives or embedded multi-media cards (eMMCs). The SSD or the eMMC serves as a data memory for a mobile device, such as a smart phone, a tablet computer, and a laptop computer, etc., and an enterprise memory array.

The controller 104 may be configured to control operations of the memory 103, such as read, erase, and program operations. The controller 104 may further be configured to manage various functions with respect to data stored or to be stored in the memory 103, including, but not limited to, bad-block management, garbage collection, logical-to-physical address conversion, wear leveling, etc. In one possible example, the controller 104 is further configured to process error correction codes (ECC) with respect to the data read from or written to the memory 103.

The controller 104 may further perform any other suitable functions, for example, format the memory 103. The controller 104 may communicate with an external device (e.g., the host 101) according to a specific communication protocol. For example, the controller 104 may communicate with the external device through at least one of various interface protocols, such as a USB protocol, a multi media card (MMC) protocol, a peripheral component interconnection (PCI) protocol, a PCI-Express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (DE) protocol, a Firewire protocol, a non-volatile memory express (NVMe) protocol, etc.

The controller 104 and the one or more memories 103 may be integrated into various types of memory systems 102, for example, be comprised in the same package (such as a universal flash storage (UFS) package or an eMMC package). For example, the memory system 102 may be implemented and packaged into different types of end electronic products.

Figure 2:
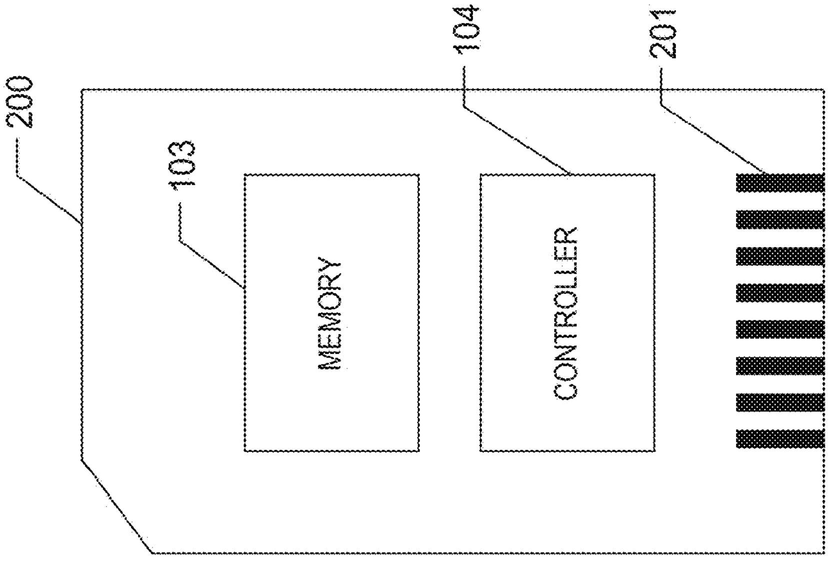
FIG. 2 is a schematic structural diagram of a memory card provided by examples of the present application.

In an example, as shown in FIG. 2, the controller 104 and a single memory 103 may be integrated into a memory card 200. The memory card 200 may comprise a personal computer memory card international association (PCMCIA) card (PC card for short), a CF card, a smart media (SM) card, a memory stick, a multimedia card (MMC, reduced-size (RS)-MMC, MMCmicro), an SD card (SD, miniSD, microSD, secure digital high capacity (SDHC)), a UFS, etc. The memory card 200 may further comprise a memory card connector 201 coupling the memory card 200 with a host (e.g., the host 101 in FIG. 1).

Figure 3:
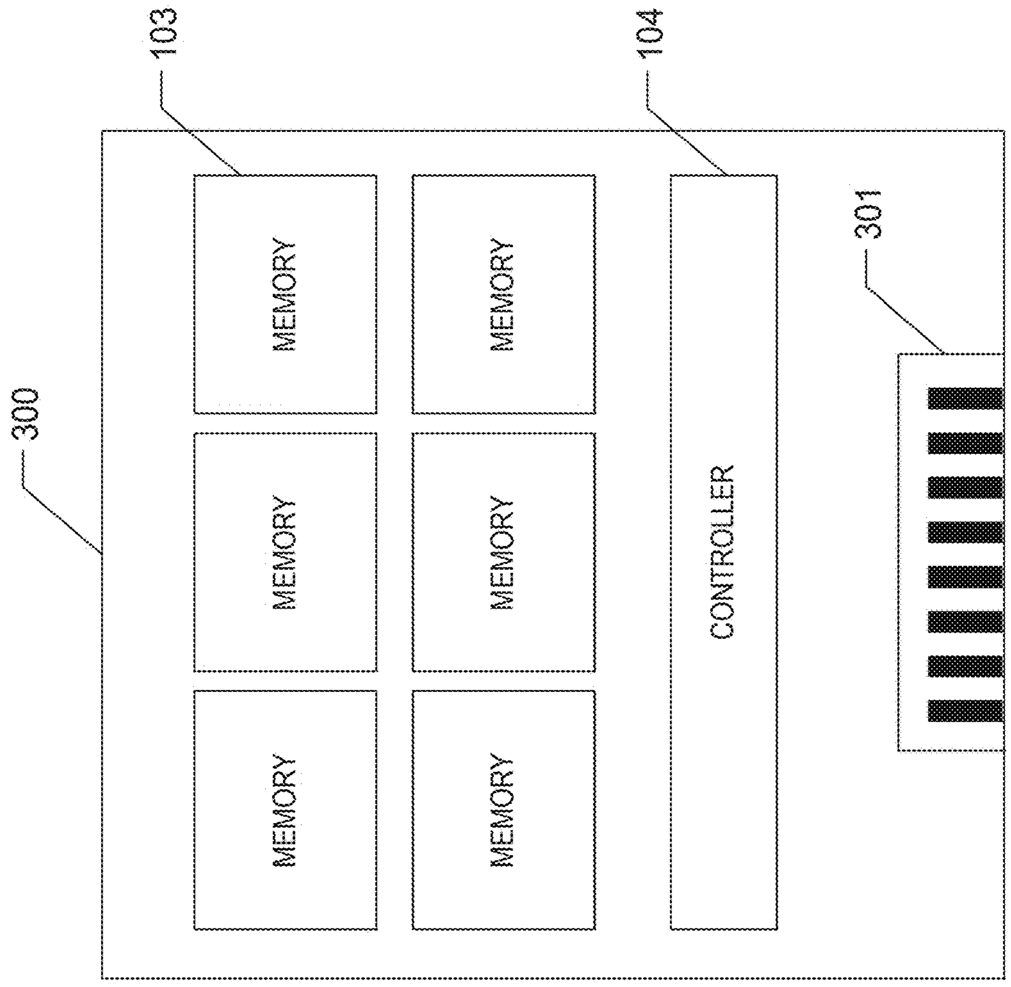
FIG. 3 is a schematic structural diagram of a solid-state disk provided by examples of the present application.

In an example, as shown in FIG. 3, the controller 104 and the plurality of memories 103 may be integrated into a solid-state disk (which may also be referred to as a solid-state drive) 300. The solid-state disk 300 may further comprise a solid-state disk connector 301 coupling the solid state disk 300 with a host (e.g., the host 101 in FIG. 1). In one possible example, at least one of the storage capacity or operation speed of the solid-state disk 300 is greater than that of the memory card 200.

Figure 4:
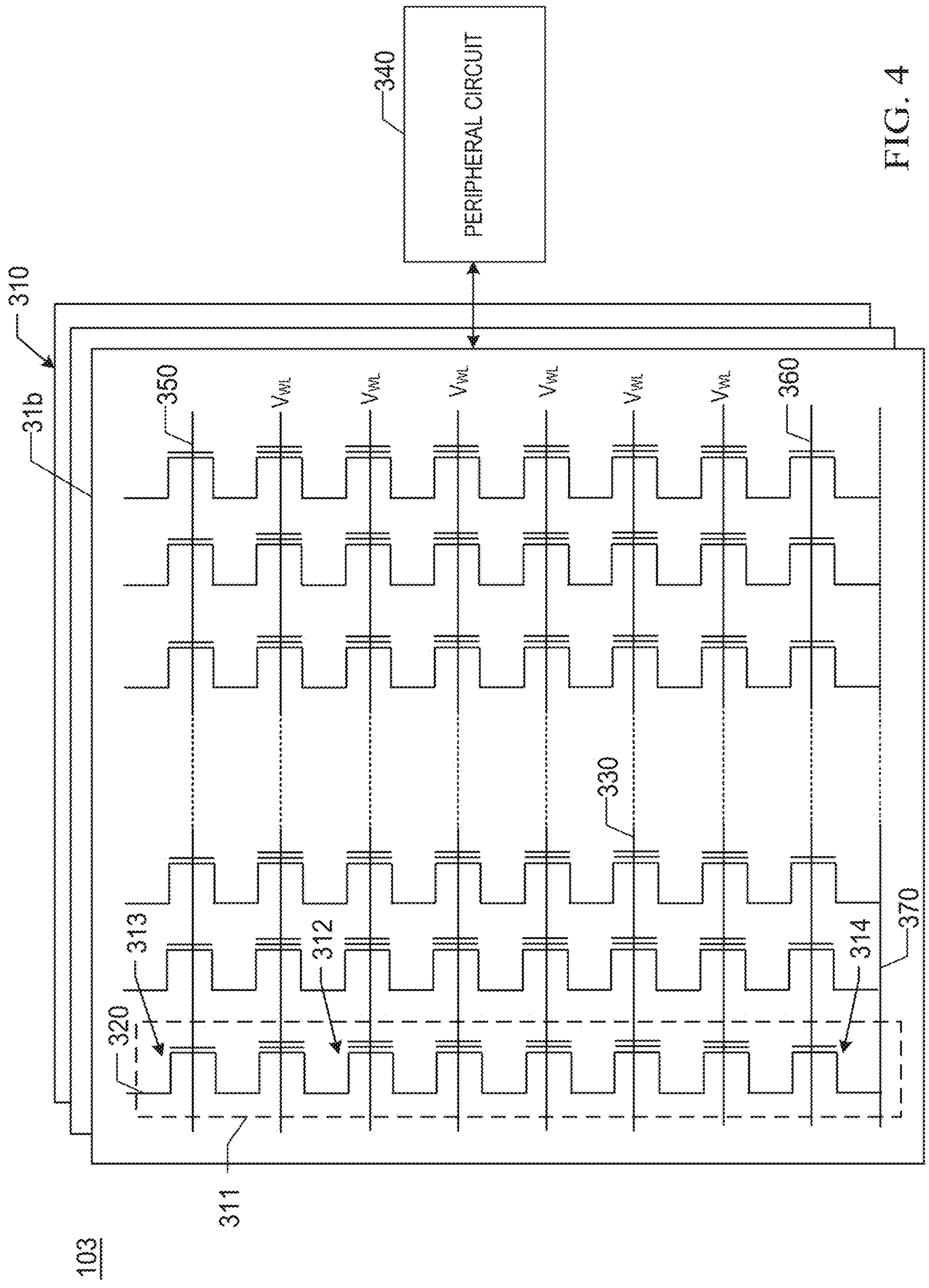
FIG. 4 is a schematic structural diagram of a memory provided by examples of the present application.

FIG. 4 is a schematic diagram of a memory provided by examples of the present application. As shown in FIG. 4, the memory 103 comprises a memory array 310, a plurality of word lines (WL) 330, and a peripheral circuit 340. The memory array 310 comprises a plurality of memory planes; the plurality of word lines 330 are coupled with memory cells 312 in the plurality of memory planes; and the peripheral circuit 340 is coupled with the plurality of word lines 330.

The memory array 310 comprises a plurality of memory strings 311. The plurality of memory strings 311 are arranged in the form of an array, are located on a bearing side of a substrate (not shown) and extend in a direction perpendicular to a bearing surface of the substrate. In an example, the bearing surface of the substrate refers to a surface of the substrate that is used for bearing the memory array 310.

Each memory string 311 comprises the plurality of memory cells 312, and the plurality of memory cells 312 in each memory string 311 are stacked in the direction perpendicular to the bearing surface of the substrate. Each memory cell 312 has a function of storing data, the stored data is determined by the number of electrons stored in the memory cell 312, and the number of electrons stored in the memory cell 312 can determine the magnitude of a threshold voltage of the memory cell 312, such that the threshold voltage of the memory cell 312 can indicate the data stored in the memory cell. The memory cell 312 is a floating gate field-effect transistor or a charge trap-type field-effect transistor.

In an example, the memory cell 312 may be a single level cell (SLC), a multi-level cell (MLC), a triple level cell (TLC), a quad level cell (QLC), or the like. The SLC, the MLC, the TLC, and the QLC can respectively store 1-bit, 2-bit, 3-bit, and 4-bit data.

Each memory string 311 further comprises a top select transistor 313 and a bottom select transistor 314; and the top select transistors 313 in different memory strings 311 at a same height or similar height from the bearing surface of the substrate are coupled to a same drain select line (DSL) 350. The bottom select transistors 314 in different memory strings 311 at a same height or similar height from the bearing surface of the substrate are coupled to a same source select line (SSL) 360. The top select transistor 313 and the bottom select transistor 314 are configured to activate the selected memory string when the memory cell is read, programmed, or erased. The top select transistor 313 is also referred to as a top select gate (TSG), and the bottom select transistor 314 is also referred to as a bottom select gate (BSG). In an example, dummy cells (DC) also exist between the top select transistor 313 and the memory cell 312, and between the bottom select transistor 314 and the memory cell 312.

One end of the memory string 311 is coupled to a bit line (BL) 320, and the other end of the memory string 311 is coupled to a source line (SL) 370.

The memory cells 312 in different memory strings 311 at the same height or similar height from the bearing surface of the substrate are at a same layer, and the plurality of memory cells 312 at the same layer constitute one memory cell layer, e.g., the memory array 310 comprises a plurality of memory cell layers, and the plurality of word lines 330 are respectively coupled to the plurality of memory cell layers. All the memory strings 311 in the memory array 310 that share the same group of word lines constitute one memory block **31*b*. Each memory plane in the memory array 310 comprises the plurality of memory blocks 31*b*; each memory block 31*b* comprises a plurality of memory pages; the memory page is a minimum unit for reading and programming (also referred to as writing); and the memory block 31*b*** is a minimum unit for erasing.

In some examples, source ends of the memory strings 311 in the same memory block 31*b* are all coupled to the same source line 370, and the source line 370 is also referred to as a common source line (CSL). For example, all the memory strings 311 in the same memory block 31*b* have array common sources (ACS). The source end of the memory string 311 refers to the end of the memory string 311 that coupled with the source line 370.

The peripheral circuit 340 may be coupled to the memory array 310 through the drain select lines 350, the source select lines 360, the bit lines 320, the source lines 370, and the word lines 330. The peripheral circuit 340 may comprise any suitable analog, digital, and mixed signal circuits for facilitating operations of the memory array 310 by applying and sensing at least one of voltage signals or current signals to and from the memory cell 312 via the drain select lines 350, the source select lines 360, the bit lines 320, the source lines 370, and the word lines 330.

The peripheral circuit 340 may comprise various types of peripheral circuits formed using the metal-oxide-semiconductor (MOS) technology. The peripheral circuit 340 can control the memory cells 312 in the selected memory string by controlling a voltage $V_{WL}$ of the word line 330 coupled with the selected memory string and a voltage $V_{BL}$ of the bit line 320 coupled with the selected memory string, so as to achieve erase, program, read, verify operations, etc. In an example, the peripheral circuit 340 may be configured to perform an operation method of a memory provided by the examples of the present application.

Figure 5:
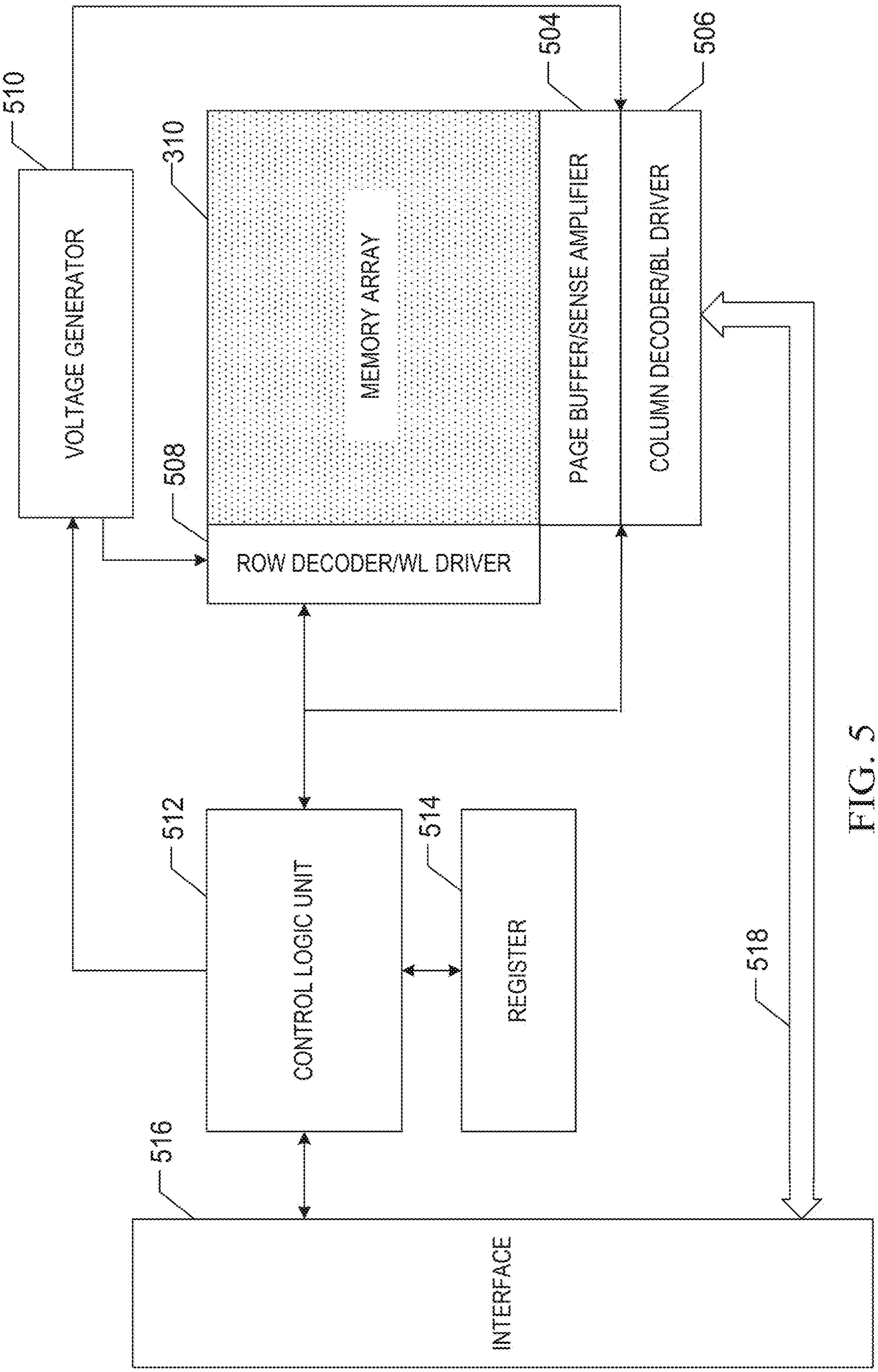
FIG. 5 is a schematic structural diagram of a peripheral circuit provided by examples of the present application.

In an example, FIG. 5 shows an example structure of the peripheral circuit 340. The peripheral circuit 340 comprises a page buffer/sense amplifier 504, a column decoder/bit line (BL) driver 506, a row decoder/word line (WL) driver 508, a voltage generator 510, a control logic unit 512, a register 514, an interface 516, and a data bus 518. It is to be understood that, in some examples, the peripheral circuit 340 may further comprise additional components not shown in FIG. 5.

The page buffer/sense amplifier 504 may be configured to read and program (write) data from and to the memory array 310 according to a control signal from the control logic unit 512. In one example, the page buffer/sense amplifier 504 may store program data (write data) to be programmed into the memory array 310. In another example, the page buffer/sense amplifier 504 may perform a program verification operation to ensure that the data has been properly programmed into the memory cell 312 coupled to the selected word line 330. In yet another example, the page buffer/sense amplifier 504 may also sense a low power signal from the bit line 320 that represents a data bit stored in the memory cell 312 and amplifies a small voltage swing to a recognizable logic level in the read operation.

The column decoder/bit line driver 506 may be configured to be controlled by the control logic unit 512 and select one or more memory strings 311 by applying a bit line voltage generated from the voltage generator 510.

The row decoder/word line driver 508 may be configured to be controlled by the control logic unit 512 and select/unselect the word lines 330 of the memory blocks 31*b* of the memory array 310. The row decoder/word line driver 508 may further be configured to drive the word lines 330 using a word line voltage ($V_{WL}$) generated from the voltage generator 510. In some examples, the row decoder/word line driver 508 may also select/unselect and drive the drain select line 350 and the source select line 360.

The voltage generator 510 may be configured to be controlled by the control logic unit 512, and generate the word line voltage (such as, a read voltage, a program voltage, a pass voltage, a local voltage, a verify voltage, etc.), the bit line voltage, and a source line voltage, which are to be supplied to the memory array 310.

The control logic unit 512 may be coupled to each peripheral circuit component described above and configured to control operations of each peripheral circuit component. In an example, the control logic unit 512 may be configured to perform the operation method of the memory provided by the examples of the present application, so as to read data from the plurality of memory planes of the memory array 310 and output the data of the plurality of memory planes in sequence according to a data output sequence.

The register 514 may be coupled to the control logic unit 512 and comprise a state register, a command register, and an address register for storing state information, a command operation code (OP code), and a command address for controlling the operations of each peripheral circuit component.

The interface 516 may be coupled to the control logic unit 512, and act as a control buffer to buffer and relay control commands received from a host (not shown) to the control logic unit 512, and buffer and relay state information received from the control logic unit 512 to the host. The interface 516 may also be coupled to the column decoder/bit line driver 506 via the data bus 518 and act as a data I/O interface and a data buffer to buffer and relay the data to and from the memory array 310.

The operation method of the memory provided in the present application refers to data output operations of the plurality of memory planes in the memory. In the data output operations of the plurality of memory planes, data of the plurality of memory planes needs to be read and output in sequence.

The data output operations of the plurality of memory planes mainly involve three phases: a pre-charge phase, a data read phase, and a data output phase. The pre-charge phase is intended to boost, to pass voltages, voltages on all word lines corresponding to the memory plane, so as to ensure that channels of memory cells coupled with the word lines are turned on, such that electrons in the channels of the memory cells are conveniently emptied, to avoid the electrons in the channels of the memory cells producing interference in the subsequent data read phase. All the word lines corresponding to the memory plane refer to word lines coupled with all memory cell layers in the memory plane. Each word line corresponding to the memory plane has a corresponding pass voltage, and the pass voltage corresponding to each word line is greater than a threshold voltage of each memory cell in the memory cell layer coupled with the word line. It is to be noted that, different word lines corresponding to the memory plane may have the same pass voltage, or may also have different pass voltages, and the examples of the present application are not limited thereto.

In one example, at the pre-charge phase in the data output operations of the plurality of memory planes, the peripheral circuit evenly allocates, to each memory plane, all charge pump cells that have been configured in the memory, and the voltages on all the word lines corresponding to each memory plane are boosted to the pass voltages by utilizing the same number of charge pump cells.

The charge pump cell is a sub-component in a charge pump circuit. The charge pump circuit is also referred to as a switched capacitor voltage converter and is a direct current-direct current (DC-DC) converter that stores energy by utilizing a capacitor (not an inductor or a transformer). The charge pump circuit is a component that is configured to generate a voltage to be supplied to the word line in a voltage generator (the voltage generator 510 in the peripheral circuit 340 shown in FIG. 5) in the peripheral circuit. For example, the charge pump circuit is a part of the voltage generator in the peripheral circuit. The charge pump circuit comprises the plurality of charge pump cells, and all the charge pump cells that have been configured in the memory are all charge pump cells comprised in the charge pump circuit. The number of the charge pump cells comprised in the charge pump circuit may be flexibly adjusted according to the power supply capacity of the memory and the ratio of the area occupied by the charge pump circuit, and the examples of the present application are not limited thereto.

Figure 6:
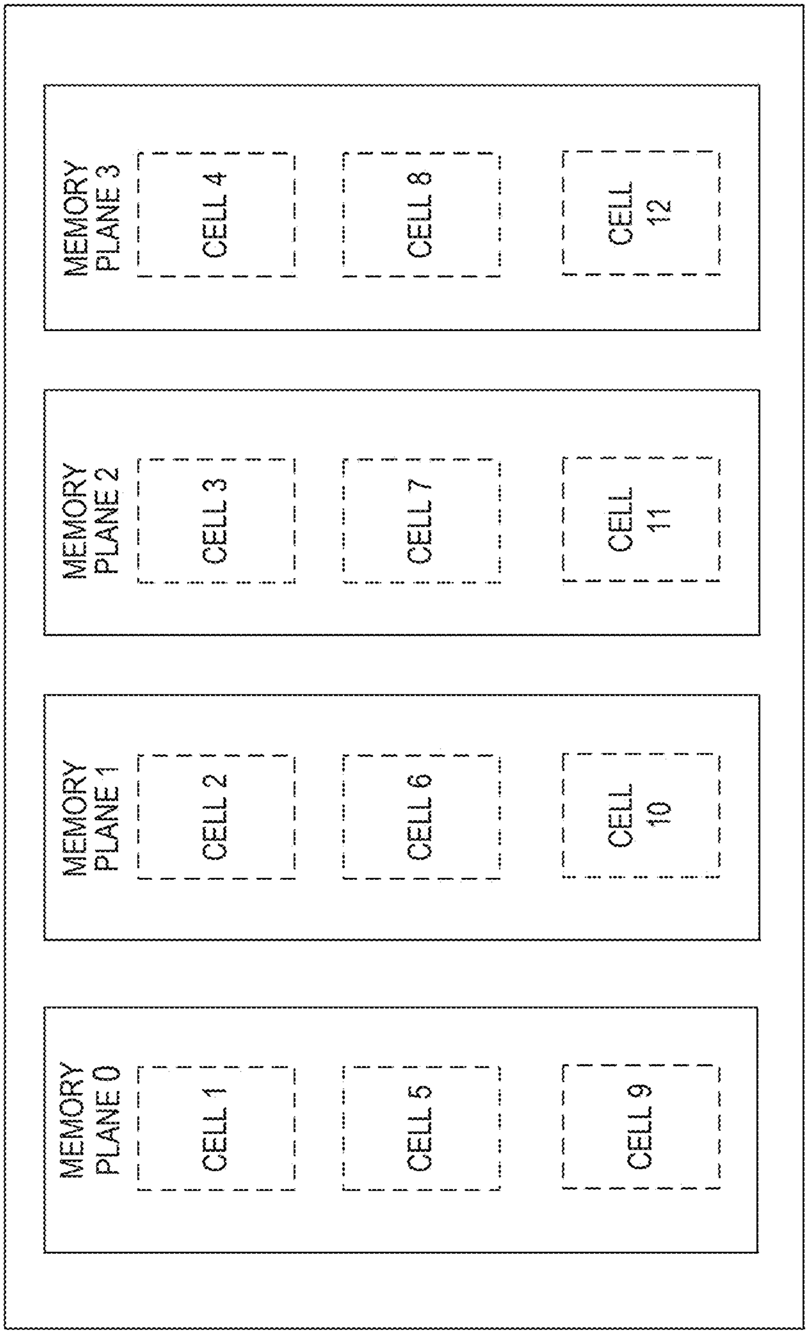
FIG. 6 is a schematic diagram of charge pump cells corresponding to memory planes provided by an example.

For example, as shown in FIG. 6, when data of 4 memory planes (a memory plane 0, a memory plane 1, a memory plane 2, and a memory plane 3) needs to be output, 12 charge pump cells that have been configured in the memory are evenly allocated to the memory planes, and each memory plane corresponds to 3 charge pump cells, e.g., at the pre-charge phase, the word lines corresponding to each memory plane all utilize the 3 charge pump cells to boost the voltages. It is to be noted that, allocation results shown in FIG. 6, that a charge pump cell 1, a charge pump cell 5, and a charge pump cell 9 are allocated to the memory plane 0, a charge pump cell 2, a charge pump cell 6, and a charge pump cell 10 are allocated to the memory plane 1, a charge pump cell 3, a charge pump cell 7, and a charge pump cell 11 are allocated to the memory plane 2, and a charge pump cell 4, a charge pump cell 8, and a charge pump cell 12 are allocated to the memory plane 4, are only example allocation results, and are not limited thereto.

Based on the operation method of one of the above-mentioned examples, all the charge pump cells in the memory need to be utilized to boost the voltages of the word lines, resulting in large power consumption. Furthermore, the number of the charge pump cells is positively correlated with boosting rates of the voltages on the word line, and the boosting rates of the voltages on the word lines corresponding to each memory plane are all relatively low due to the limitation of even allocation.

In the data output operations of the plurality of memory planes, a key indicator is a data output duration (tR), which refers to a duration between the time when the host sends a data output command and the time when the host receives an output response of data of the memory plane of which data output sequence is the first. The output response of the data of the memory plane of which data output sequence is the first is used for notifying that the data of the memory plane of which data output sequence is the first is about to be output (which may also be understood as being used for notifying that the data is about to be output); and the output response of the data of the memory plane of which data output sequence is the first may be sent to the host through the controller after the peripheral circuit reads the data of the memory plane of which data output sequence is the first.

Since the data of the memory plane of which data output sequence is the first is immediately output after being read, a length of the data output duration is positively correlated with a read duration of the data of the memory plane of which data output sequence is the first. The read duration of the data of the memory plane of which data output sequence is the first may be considered as a duration between reference time and read completion time corresponding to the memory plane of which data output sequence is the first, wherein the reference time may refer to the time when the peripheral circuit receives the data output command, or may also refer to pre-charging start time of the memory plane of which data output sequence is the first, and so on. The read completion time corresponding to the memory plane of which data output sequence is the first refers to the time when all the data of the memory plane of which data output sequence is the first has been read.

When the boosting rates of the voltages on the word lines corresponding to each memory plane are all relatively low, the pre-charging of the memory plane of which data output sequence is the first takes longer time, causing the read duration of the data of the memory plane of which data output sequence is the first to be relatively long, and thus resulting in long data output duration. Therefore, in one of the above-mentioned examples, the data output operations of the plurality of memory planes consume more power and data output duration is relatively long, thereby causing the operation performance of the data output operations of the plurality of memory planes to be relatively poor. Based on this, examples of the present application provide an operation method of a memory. The operation method of the memory can improve the operation performance of the data output operations of the plurality of memory planes.

The operation method of the memory provided by the examples of the present application is explained and described below.

Figure 7:
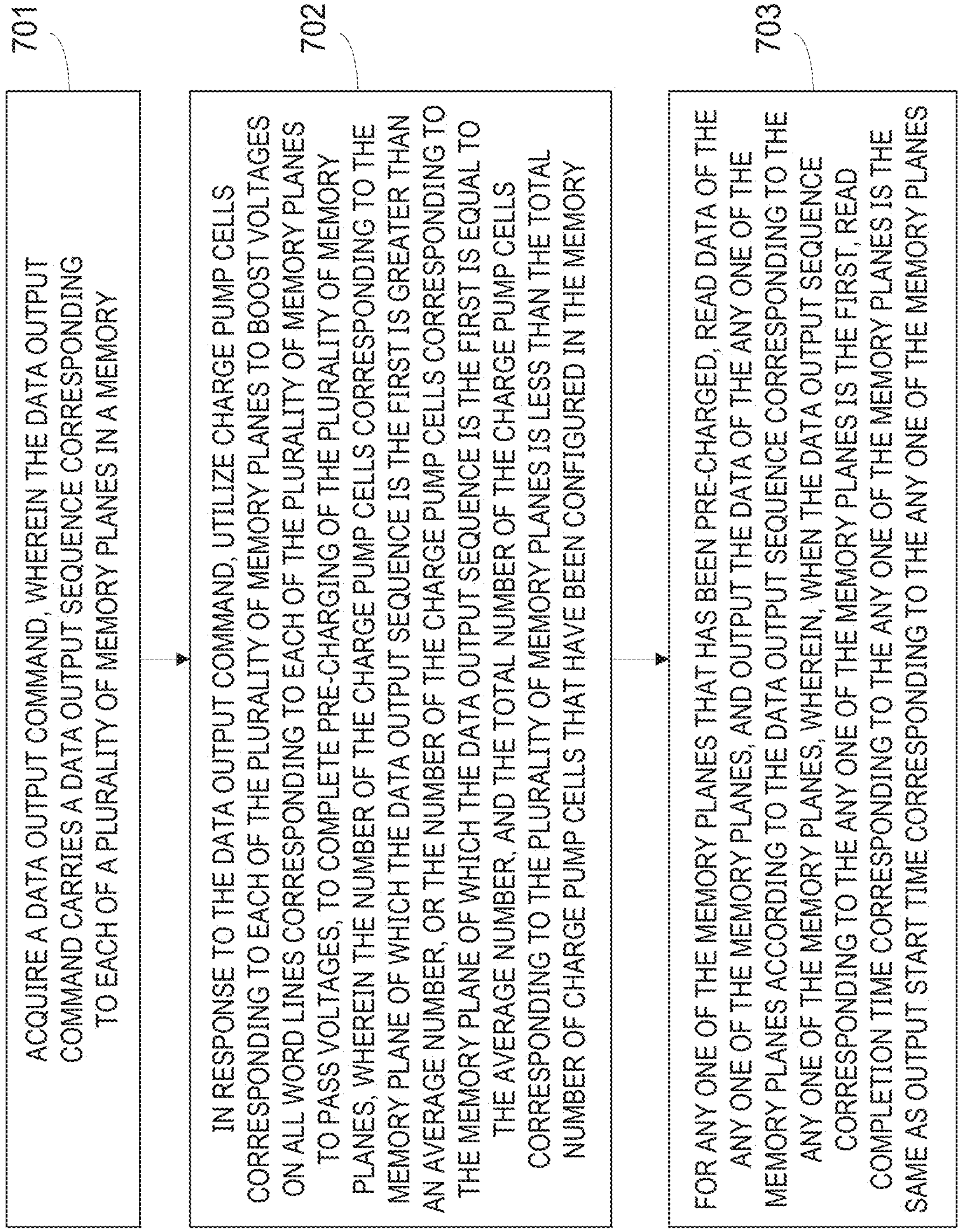
FIG. 7 is a flow diagram of an operation method of a memory provided by examples of the present application.

FIG. 7 is a flow diagram of an operation method of a memory provided by examples of the present application. The method may be applied to a peripheral circuit of the memory. In an example, the method may be applied to a control logic unit in the peripheral circuit, and subsequent examples are explained and described by using the peripheral circuit as an execution subject. As shown in FIG. 7, the operation method of the memory provided by the examples of the present application comprises the following Operations 701 to 703.

In Operation 701, acquiring a data output command, wherein the data output command carries a data output sequence corresponding to each of a plurality of memory planes in a memory.

The data output command is a command that causes the peripheral circuit to output data of the plurality of memory planes in the memory, and the data output command carries the data output sequence corresponding to each of the plurality of memory planes in the memory, for example, output sequences of the data of the plurality of memory planes are specified in the data output command. It is to be noted that, the plurality of memory planes involved in the examples of the present application refer to a plurality of memory planes corresponding to the data output command, e.g., the plurality of memory planes involved here refer to the plurality of memory planes in which data needs to be read as indicated by the data output command. The plurality of memory planes involved here may refer to all the memory planes in the memory or may also refer to part of the memory planes in the memory, and the examples of the present application are not limited thereto. In examples, the data output command may be referred to as a multiplane cache read command.

The data output sequence corresponding to any one of the memory planes is to indicate the ranking in which the data of the any one of memory planes among the data of the plurality of memory planes is output, for example, the data output sequence corresponding to the any one of the memory planes may be the first, second, etc. Different memory planes correspond to different data output sequences. The data output sequences corresponding to the plurality of memory planes are sequences arranged sequentially. For example, the data output command carries the data output sequence corresponding to each of 3 memory planes (respectively being the memory plane 0, the memory plane 1, and the memory plane 2) in the memory, wherein the data output sequence corresponding to the memory plane 0 is the first, the data output sequence corresponding to the memory plane 1 is the second, and the data output sequence corresponding to the memory plane 2 is the third.

In an example, the data output command may carry, in a form of a key-value pair, the data output sequence corresponding to each of the plurality of memory planes, wherein an identifier of the memory plane is the key, and the data output sequence corresponding to the memory plane is the value. In an example, the data output command may carry the identifiers of the plurality of memory planes that are arranged according to the data output sequences, such that the peripheral circuit learns the data output sequence corresponding to each of the plurality of memory planes based on the arrangement sequence of the identifiers of the plurality of memory planes.

The data output command is sent by the host. For example, when the host needs to acquire the data of the plurality of memory planes, the data output command is sent. The memory planes involved in the data output command sent by the host, as well as the data output sequence corresponding to each of the memory planes, may be flexibly set according to data acquisition requirements of the host, and the examples of the present application are not limited thereto. In an example, the host sending the data output command means that the host sends the data output command to the controller. The controller is configured to control the memory. After the host sends the data output command to the controller, the controller receives the data output command, and after the controller receives the data output command, the controller sends the data output command to the peripheral circuit in the memory, such that the peripheral circuit outputs the data of the plurality of memory planes. For example, the way that the peripheral circuit acquires the data output command comprises: the peripheral circuit receiving the data output command sent by the controller.

In examples, the host is provided with a first interface, the controller is provided with a second interface, and the host and the memory system are coupled through the first interface and the second interface to achieve information interaction, wherein the memory system comprises the memory and the controller. In this case, the host sending the data output command to the controller means that the host sends the data output command to the controller through the first interface, and the controller receiving the data output command means that the controller receives the data output command through the second interface.

In Operation 702, in response to the data output command, utilizing charge pump cells corresponding to each of the plurality of memory planes to boost voltages on all word lines corresponding to each of the plurality of memory planes to pass voltages, to complete pre-charging of the plurality of memory planes, wherein the number of the charge pump cells corresponding to the memory plane of which the data output sequence is the first is greater than an average number, or the number of the charge pump cells corresponding to the memory plane of which the data output sequence is the first is equal to the average number, and the total number of the charge pump cells corresponding to the plurality of memory planes is less than the total number of charge pump cells that have been configured in the memory.

After acquiring the data output command, the peripheral circuit performs operations of the pre-charge phase in response to the data output command. For example, after acquiring the data output command, the peripheral circuit immediately perform the operations of the pre-charge phase, so as to improve data output efficiency.

In the examples of the present application, the operation of the pre-charge phase comprises: utilizing charge pump cells corresponding to each of the plurality of memory planes to boost voltages on all word lines corresponding to each of the plurality of memory planes to pass voltages. After the voltages on all the word lines corresponding to each of the plurality of memory planes are boosted to the pass voltages, the pre-charging of the plurality of memory planes is completed.

In an example, the process of utilizing charge pump cells corresponding to any one the plurality of memory planes to boost voltages on all word lines corresponding to the any one of the plurality of memory planes to pass voltages comprises: determining, by the peripheral circuit, the charge pump cells corresponding to the any one of the memory planes, sending a word line control signal corresponding to the any one of the memory planes to the voltage generator, wherein the word line control signal carries identifiers of the charge pump cells corresponding to the any one of the memory plane; and analyzing, by the voltage generator, the word line control signal, and determining the charge pump cells corresponding to the any one of the memory planes, and driving, by the voltage generator, the charge pump cells corresponding to the any one of the memory planes to boost the voltages on all the word lines corresponding to the any one of the memory planes to the pass voltages.

In the examples of the present application, the plurality of memory planes correspond to the charge pump cells respectively, and the charge pump cells corresponding to the plurality of memory planes respectively meet either Constraint I or Constraint II below.

Constraint I: the number of the charge pump cells corresponding to the memory plane of which the data output sequence is the first is greater than an average number.

The average number refers to a ratio of the total number of charge pump cells that have been configured in the memory to the number of the plurality of memory planes corresponding to the data output command, e.g., the number of the charge pump cells that are evenly allocated to each memory plane in one example. When the charge pump cells corresponding to each of the plurality of memory planes meet the Constraint I, since the number of the charge pump cells is positively correlated with the boosting rate of the voltage on the word line, the word line corresponding to the memory plane of which data output sequence is the first can be boosted to the pass voltage more quickly, such that data read and data output operations can be performed more quickly, so as to shorten the data output duration. Since that the total number of the charge pump cells corresponding to the plurality of memory planes does not exceed the total number of charge pump cells that have been configured in the memory, the power consumption consumed to boost the voltage on the word line utilizing the charge pump cells is not increased.

It is to be noted that, when the Constraint I is met, the total number of the charge pump cells corresponding to the plurality of memory planes may be equal to the total number of charge pump cells that have been configured in the memory, or may also be less than the total number of charge pump cells that have been configured in the memory. If the total number of the charge pump cells corresponding to the plurality of memory planes is less than the total number of charge pump cells that have been configured in the memory, when the Constraint I is met, the data output duration may be shortened, and the power consumption consumed to boost the voltage on the word line utilizing the charge pump cells may also be reduced.

Constraint II: the number of the charge pump cells corresponding to the memory plane of which the data output sequence is the first is equal to the average number, and the total number of the charge pump cells corresponding to the plurality of memory planes is less than the total number of charge pump cells that have been configured in the memory.

When the charge pump cells corresponding to each of the plurality of memory planes meet the Constraint II, although the data output duration maintains unchanged as the number of the charge pump cells corresponding to the first memory plane is equal to the average number, the total number of the charge pump cells corresponding to the plurality of memory planes is less than the total number of charge pump cells that have been configured in the memory, such that the number of the charge pump cells used for boosting the voltage on the word line can be reduced, thereby reducing the power consumption consumed to boost the voltage on the word line utilizing the charge pump cells.

In one possible example, on the basis of the charge pump cells corresponding to each of the plurality of memory planes meeting the above-mentioned Constraint I or Constraint II, the charge pump cells corresponding to each of the plurality of memory planes further meet Constraint III below.

Constraint III: the number of the charge pump cells corresponding to any one of the plurality of memory planes is positively correlated with the data output sequence corresponding to the any one of the memory planes.

For example, the more forward the data output sequence corresponding to the any one of the memory planes, the more the charge pump cells corresponding to the any one of the plurality of memory planes. For example, if the plurality of memory planes comprise a first memory plane and a second memory plane, the data output sequence corresponding to the first memory plane is prior to the data output sequence corresponding to the second memory plane, the number of the charge pump cells corresponding to the first memory plane is greater than the number of the charge pump cells corresponding to the second memory plane.

The more backward the data output sequence, the lower requirements of the memory plane for the data reading duration, e.g., the memory plane with the more backward data output sequence may utilize a longer data reading duration to read data, e.g., may utilize a slower voltage boosting rate to boost the corresponding word lines to the pass voltages, so as to configure such memory plane with a smaller number of the charge pump cells. Based on such example, a time difference between the time when data of the memory planes with different data output sequences is output can be fully utilized, and the data output duration is further shortened by utilizing limited charge pump cells, or on the basis of maintaining the data output duration unchanged, the total number of the charge pump cells used at the pre-charge phase is further reduced, thereby further reducing power consumption.

Figure 8:
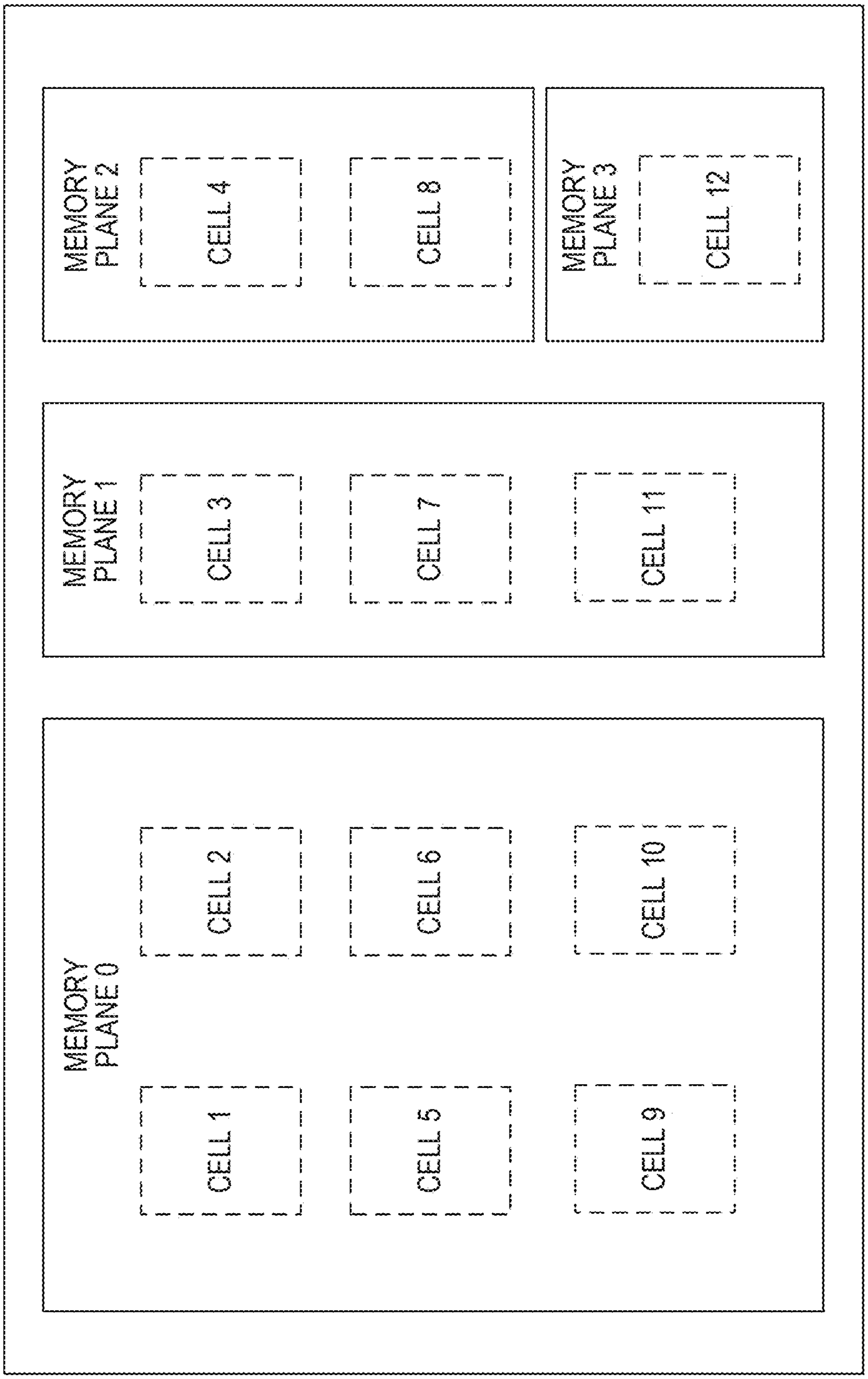
FIG. 8 is a schematic diagram of charge pump cells corresponding to memory planes provided by examples of the present application.

For example, when the data of 4 memory planes, which are the memory plane 0, the memory plane 1, the memory plane 2, and the memory plane 3, needs to be output in sequence, the charge pump cells corresponding to each memory plane may be shown in FIG. 8. The memory plane 0 of which data output sequence is the first corresponds to 6 charge pump cells (which respectively are the charge pump cell 1, the charge pump cell 2, the charge pump cell 5, the charge pump cell 6, the charge pump cell 9, and the charge pump cell 10); the memory plane 1 of which data output sequence is the second corresponds to 3 charge pump cells (which respectively are the charge pump cell 3, the charge pump cell 7, and the charge pump cell 11); the memory plane 2 of which data output sequence is the third corresponds to 2 charge pump cells (which respectively are the charge pump cell 4 and the charge pump cell 8); and the memory plane 3 of which data output sequence is the fourth corresponds to 1 charge pump cell (the charge pump cell 12). The number of the charge pump cells corresponding to each of the memory plane 0, the memory plane 1, the memory plane 2, and the memory plane 3 is positively correlated with the data output sequence corresponding to each of the memory plane 0, the memory plane 1, the memory plane 2, and the memory plane 3. It is to be noted that, the allocation result of the charge pump cells shown in FIG. 8 is only an example description, and is not limited thereto.

Before utilizing charge pump cells corresponding to each of the plurality of memory planes to boost voltages on all word lines corresponding to each of the plurality of memory planes to pass voltages, the charge pump cells corresponding to each of the plurality of memory planes need to be determined first. In one possible example, the process of determining the charge pump cells corresponding to each of the plurality of memory planes comprises Operation A and Operation B.

Operation A: acquiring a first correspondence relationship, wherein the first correspondence relationship is to indicate a correspondence relationship between the data output sequence and the charge pump cells.

The first correspondence relationship is a correspondence relationship that is preset and used for indicating a correspondence relationship between the data output sequence and the charge pump cells. In an example, the first correspondence relationship may be stored in the peripheral circuit (e.g., stored in the control logic unit), such that the peripheral circuit can directly extract the first correspondence relationship. In an example, the first correspondence relationship may be stored in the controller, and the peripheral circuit acquires the first correspondence relationship by interacting with the controller. It is to be noted that, the first correspondence relationship may be acquired when the charge pump cells corresponding to each of the plurality of memory planes need to be determined, e.g., after the data output command is acquired, or may also be acquired before the data output command is acquired, and the examples of the present application are not limited thereto.

Operation B: determining the charge pump cells corresponding to each of the plurality of memory planes based on the data output sequence corresponding to each of the plurality of memory planes and the first correspondence relationship.

Since the first correspondence relationship is used for indicating the correspondence relationship between the data output sequence and the charge pump cells, after the first correspondence relationship is acquired, the charge pump cells corresponding to each of the data output sequences corresponding to the plurality of memory planes may be determined according to the first correspondence relationship, such that the charge pump cells corresponding to each of the plurality of memory planes are determined.

Under the examples described in the above-mentioned Operation A and Operation B, the correspondence relationship between the data output sequence and the charge pump cells is preset, such that the charge pump cells corresponding to each of the memory planes can be directly determined according to the correspondence relationship, and the efficiency of determining the charge pump cells corresponding to each of the memory planes is improved.

In another possible example, the process of determining the charge pump cells corresponding to each of the plurality of memory planes comprises Operation 1 to Operation 3.

Operation 1: acquiring a second correspondence relationship, wherein the second correspondence relationship is to indicate a correspondence relationship between the data output sequence and the number of the charge pump cells.

The second correspondence relationship is a correspondence relationship that is preset and used for indicating the number of the charge pump cells corresponding to the data output sequence. In an example, the second correspondence relationship may be stored in the peripheral circuit (e.g., stored in the control logic unit), such that the peripheral circuit can directly extract the second correspondence relationship. In an example, the second correspondence relationship may be stored in the controller, and the peripheral circuit acquires the second correspondence relationship by interacting with the controller. It is to be noted that, the second correspondence relationship may be acquired when the charge pump cells corresponding to each of the plurality of memory planes need to be determined, e.g., after the data output command is acquired, or may also be acquired before the data output command is acquired, and the examples of the present application are not limited thereto.

Operation 2: determining the charge pump cells corresponding to each of the plurality of memory planes based on the data output sequence corresponding to each of the plurality of memory planes and the second correspondence relationship.

Since the second correspondence relationship is used for indicating the correspondence relationship between the data output sequence and the number of the charge pump cells, after the second correspondence relationship is acquired, the number of the charge pump cells corresponding to each of the data output sequences corresponding to the plurality of memory planes may be determined according to the second correspondence relationship, such that the number of the charge pump cells corresponding to each of the plurality of memory planes is determined.

Operation 3: determining the charge pump cells corresponding to each of the plurality of memory planes from the charge pump cells that have been configured in the memory based on the number of the charge pump cells corresponding to each of the plurality of memory planes.

After the number of the charge pump cells corresponding to each of the plurality of memory planes is determined, for any one of the memory planes, the peripheral circuit may select, from the charge pump cells that have been configured in the memory, the charge pump cells conforming to the number of the charge pump cells corresponding to the any one of the memory planes, and use the selected charge pump cells as the charge pump cells allocated to the any one of the memory planes, e.g., the charge pump cells corresponding to the any one of the memory planes.

In an example, the peripheral circuit may randomly select, from the charge pump cells that have been configured in the memory, the charge pump cells conforming to the number of the charge pump cells corresponding to the any one of the memory planes. In an example, the peripheral circuit may select, from the charge pump cells that have been configured in the memory, according to a preset allocation principle, the charge pump cells conforming to the number of the charge pump cells corresponding to the memory plane. The preset allocation principle may be set according to experience, or may also be flexibly adjusted according to application requirements, and the examples of the present application are not limited thereto. In an example, the charge pump cells that have been configured in the memory have respective numbers, the correspondence relationship between a range of the numbers of the charge pump cells and the data output sequence may be set in the allocation principle, and then, the process that the peripheral circuit selects, from the charge pump cells that have been configured in the memory, according to the allocation principle, the charge pump cells conforming to the number of the charge pump cells corresponding to the any one of the memory planes may comprise: the peripheral circuit determining, according to the allocation principle and a memory sequence of the any one of the memory planes, the range of the numbers of the charge pump cells corresponding to the any one of the memory planes, and selecting, from the charge pump cells corresponding to the range of the number, the charge pump cells conforming to the number of the charge pump cells corresponding to the any one of the memory planes.

Based on the same principle, the charge pump cells corresponding to each of the plurality of memory planes can be determined. In an example, there is no crossover between the charge pump cells corresponding to different memory planes, e.g., the charge pump cells corresponding to different memory planes are different, such that the plurality of memory planes can start to be pre-charged at a same moment, thereby improving the convenience of control. Therefore, the charge pump cells conforming to the number of the charge pump cells corresponding to any one of the memory planes are selected from the charge pump cells that have been configured in the memory but are not allocated to other memory planes.

In the examples described in the above-mentioned Operation 1 to Operation 3, the correspondence relationship between the data output sequence and the number of the charge pump cells is preset, such that the number of the charge pump cells corresponding to each of the memory planes can be first determined according to the correspondence relationship, the charge pump cells conforming to the number are then determined, and the flexibility of determining the charge pump cells corresponding to each of the plurality of memory planes is improved.

In one possible example, the maximum value of respective instantaneous currents generated during a pre-charging process of the plurality of memory planes is not greater than a current threshold. In the process of pre-charging the plurality of memory planes, a current is generated since the operation of applying the voltage to the word line is involved, such that the current generated during the process of pre-charging the plurality of memory planes may be tested. For example, the current is tested every reference duration, and the reference duration is set according to experience, for example, the reference duration may be 1 second, or may also be 3 seconds, and so on. The current obtained through each test is an instantaneous current at one moment. Through the rational arrangement of the charge pump cells corresponding to each of the plurality of memory planes, the maximum value of respective instantaneous currents generated during the process of pre-charging the plurality of memory planes can be less than or equal to the current threshold, so as to avoid memory damage due to a too large instantaneous current, thereby improving operation safety. The current threshold may be considered as a safe current for memory operation. The current threshold may be set according to experience, or may also be flexibly adjusted according to an application scenario, and the examples of the present application are not limited thereto. In an example, the current threshold may refer to a peak current of the memory.

In Operation 703, for any one of the memory planes that has been pre-charged, reading data of the any one of the memory planes, and outputting the data of the any one of the memory planes according to the data output sequence corresponding to the any one of the memory planes, wherein, when the data output sequence corresponding to the any one of the memory planes is the first, read completion time corresponding to the any one of the memory planes is the same as output start time corresponding to the any one of the memory planes.

After the pre-charging of the plurality of memory planes is completed, data read and data output operations of the plurality of memory planes are performed. The principles for the data read and data output operations of different memory planes are the same. In the examples of the present application, an example process of the data read and data output operations of any one of the memory planes is introduced by using the memory plane that has been pre-charged as an example.

In one possible example, an example process of reading data of the any one of the memory planes comprises: adjusting a voltage on a selected word line among all the word lines corresponding to the any one of the memory planes from the pass voltage to a read voltage; and reading, based the read voltage, data to be read in the any one of the memory planes. In any one of the memory planes, there may be memory cells (selected memory cells) in which data needs to be read and memory cells (non-selected memory cells) in which data does not need to be read. In examples, the data output command may carry identifier information of the selected memory cell corresponding to any one of the memory planes, and the word line coupled with a memory cell layer where the selected memory cell is located is used as a selected word line among all the word lines corresponding to the any one of the memory planes.

In the process of reading the data of any one of the memory planes, the voltage on the selected word line corresponding to the any one of the memory planes is a read voltage, and voltages on other word lines other than the selected word line corresponding to the any one of the memory planes are the pass voltages. The read voltage may comprise one or more read voltages, which is related to a type of the memory cell in the memory cell layer coupled with the selected word line.

For example, if the type of the memory cell is an SLC, data stored in the memory cell comprises “1” and “0”, the number of the read voltages is one, the read voltage is between a threshold voltage of the memory cell with data “1” being stored therein and a threshold voltage of the memory cell with data “0” being stored therein, and whether the data stored in the memory cell is “1” or “0” can be determined according to whether the read voltage can turn on a channel of the memory cell.

For another example, if the type of the memory cell is a TLC, the data stored in the memory cell comprises “111”, “110”, “100”, “000”, “010”, “011”, “001”, and “101”, the memory cells storing different data have different threshold voltages, and when the read voltage applied to the word line coupled with the memory cell is greater than or equal to the threshold voltage of the memory cell, the memory cell may be turned-on. In this way, for one word line, different read voltages may be applied to the word line in sequence, and then the data stored in the memory cell coupled with the word line is determined according to the turn-on state of the memory cell coupled with the word line after different read voltages are applied.

In an example, whether the memory cell is in the turn-on state may be determined by determining whether there is a current flowing through a bit line of a memory string where the memory cell is located. In an example, when the data stored in the memory cell in any one of layers is read, all bit lines may be first pre-charged to a preset voltage, and then the read voltage is applied to the word line corresponding to the layer, so as to make the read voltage applied to the word line act on a gate of each memory cell. For any one of the memory cells in the layer, if the read voltage applied to the memory cell is greater than or equal to the threshold voltage of the memory cell, the memory cell is turned on, causing the voltage of the bit line coupled with the memory cell to reduce. Therefore, the turn-on state of the corresponding memory cell may be determined by testing a voltage value of the bit line.

After the data of any one of memory planes is read, the data of the any one of the memory planes is output according to the data output sequence corresponding to the any one of the memory planes. It is to be noted that, if the data output sequence corresponding to the any one of the memory planes is the first, the read completion time corresponding to the any one of the memory planes is the same as the output start time corresponding to the any one of the memory planes, wherein the read completion time corresponding to the any one of the memory planes is the time when all the data of the any one of the memory planes has been read, and the output start time corresponding to the any one of the memory planes is the time when the data of the any one of the memory planes starts to be output. For example, for the memory plane of which data output sequence is the first, after the data of the memory plane has been completely read, regardless of whether the data of other memory planes has been read, the data of the memory plane is immediately (e.g., no interruption in time) output, such that the data output duration is shortened, and the operation efficiency of the data output operation is improved.

In an example, if the data output sequence corresponding to the any one of the memory planes is not first, the read completion time corresponding to the any one of the memory planes may be the same as the output start time corresponding to the any one of the memory planes, or may also be earlier than the output start time corresponding to the any one of the memory planes. For example, when the data output sequence corresponding to any one of the memory planes is not the first, the read completion time corresponding to any one of the memory planes is not later than the output start time corresponding to the any one of the memory planes, so as to ensure that the data of any one of the memory planes has been read before being output, thereby avoiding output errors.

In Operation 703, the process of the data read and data output operations for any one of memory planes is introduced by using the any one of the memory planes as an example. Based on the same principle, the data read and data output operations of the plurality of memory planes can be realized, such that the data output operations of the plurality of memory planes corresponding to a data output instruction are completed.

From the overall process of the data output operations of the plurality of memory planes, the data of the plurality of memory planes are output in sequence according to the data output sequence corresponding to each of the plurality of memory planes. For example, output start time corresponding to the memory plane of which the data output sequence is the $N^{th}$ is not earlier than output completion time corresponding to the memory plane of which the data output sequence is the $N-1^{th}$, wherein N is an integer greater than 1. The output completion time corresponding to any one of the memory planes refers to the time when the data of the any one of the memory planes has been completely output.

In examples, the output start time corresponding to the memory plane of which the data output sequence is the $N^{th}$ is the same as output completion time corresponding to the memory plane of which the data output sequence is the $N-1^{th}$. For example, after the data of the memory plane of which data output sequence is the $N-1^{th}$ has been completely output, the data of the memory plane of which data output sequence is the $N^{th}$ starts to be immediately (e.g., no interruption in time) output. In this way, the data of the plurality of memory planes can be guaranteed to be output without interruption, an overall output duration of the data of all the memory planes is shortened, and the operation performance of the data output operations of the plurality of memory planes is improved.

In the technical solutions provided by the examples of the present application, if the number of the charge pump cells corresponding to the memory plane of which data output sequence is the first is greater than the average number, since the number of the charge pump cells is positively correlated with the boosting rate of the voltage on the word line, the word line corresponding to the memory plane of which data output sequence is the first can be boosted to the pass voltage more quickly, such that data read and data output operations can be performed more quickly, so as to shorten the data output duration. And since the total number of the charge pump cells corresponding to the plurality of memory planes does not exceed the total number of charge pump cells that have been configured in the memory, the power consumption consumed to boost the voltage on the word line utilizing the charge pump cells is not increased.

If the number of the charge pump cells corresponding to the memory plane of which data output sequence is the first is equal to the average number, although the data output duration maintains unchanged, the total number of the charge pump cells corresponding to the plurality of memory planes is less than the total number of charge pump cells that have been configured in the memory, such that the number of the charge pump cells used for boosting the voltage on the word line can be reduced, thereby reducing the power consumption consumed to boost the voltage on the word line utilizing the charge pump cells.

According to the above-mentioned analysis, it can be learned that, in the technical solutions provided by the examples of the present application, the data output duration can be shortened without increasing power consumption, or power consumption can be reduced on the basis of maintaining the data output duration unchanged, such that the overall operation performance of data output operations of a plurality of memory planes can be improved.

The examples of the present application may be considered as an operation method for balancing the data output duration and the total number of the charge pump cells utilized during the process of outputting the data of the plurality of memory planes. Since the charge pump cell needs to occupy a certain area, if the total number of the charge pump cells utilized is reduced, the area occupied by the charge pump cells may be reduced, so as to reduce an area of the charge pump circuit comprising the charge pump cells is reduced. Therefore, the examples of the present application may also be considered as an operation method for balancing the data output duration and the area of the charge pump circuit during the process of outputting the data of the plurality of memory planes.

Next, inventive concept of the present application is explained and described:

As 3D NAND layers are stacked higher and higher, the size of the memory plane becomes larger and larger, and the power consumption required to charge the selected word line during a read operation becomes larger and larger, but the capability of external power supply needs to be taken into consideration during system operations, and in order to balance the power consumption, the data output duration needs to be sacrificed often; and as the number of layers is increased, the area for transistors becomes smaller and smaller, and the area for the charge pump to charge the word line becomes more and more critical to the chip size, such that how to balance the power consumption and the data output duration needs to be studied deeply.

Since data is output by the plurality of memory planes in sequence when being output by a chip, e.g., the data of one memory plane must be output first, and then data of the next memory plane is output. Under a special application scenario with high requirements on the data output duration, when the data output operations of the plurality of memory planes are performed, by re-configuring the charge pump cells of a charge circuit at a power supply portion, the word line of the memory plane that first outputs the data is rapidly charged with the highest drive capability, such that the data output duration of the memory plane that first outputs the data is saved, and the second and subsequent memory planes that output the data may reuse a time difference between data output, so as to allow the word line to be charged at a slower time, and compensate the impact of the peak current and the area of the charge pump circuit. After the peripheral circuit (or the control logic unit in the peripheral circuit) receives the data output commands corresponding to the plurality of memory planes, the charge pump cells are re-configured, and the mode of evenly allocating the charge pump cells is converted into the mode of allocating more charge pump cells for the memory planes that first output the data, and allocating fewer charge pump cells for the memory planes that output the data later. A pre-charging duration of the memory plane that first outputs the data may be greatly shortened without affecting the performance of the peak current (e.g., the maximum instantaneous current during the pre-charging process is not greater than the peak current), such that the data output duration is shortened.

In the examples of the present application, the shortening of the data output duration may be realized by combining firmware (FW) with changes in circuit logic, without extra consumption in the area of the charge pump circuit, or under the limited area of the charge pump circuit, the data output duration can be maximally optimized. As areas for transistors in later projects become smaller and smaller, after the area of the charge pump circuit is reduced, the word line of the memory plane that outputs the data early may be rapidly charged, and the memory plane that outputs the data later may be charged slowly, according to the principle of unevenly allocating the charge pump cells.

Figure 9:
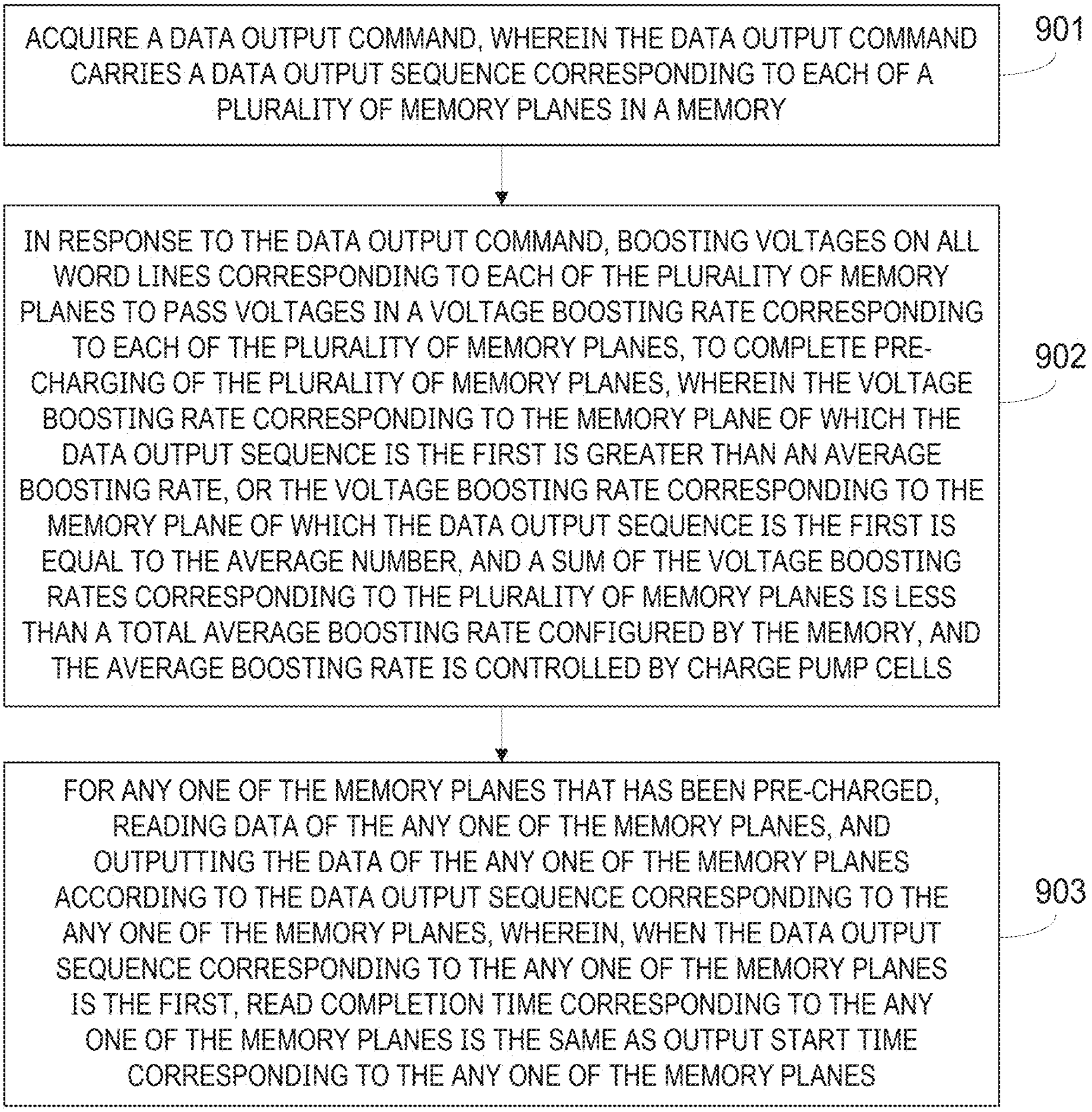
FIG. 9 is a flow diagram of another operation method of a memory provided by examples of the present application.

FIG. 9 is a flow diagram of another operation method of a memory provided by examples of the present application. The method may be applied to a peripheral circuit of the memory. In an example, the method may be applied to a control logic unit in the peripheral circuit, and subsequent examples are explained and described by using the peripheral circuit as an execution subject. As shown in FIG. 9, the operation method of the memory provided by the examples of the present application comprises the following Operations 901 to 903.

In Operation 901, acquiring a data output command, wherein the data output command carries a data output sequence corresponding to each of a plurality of memory planes in a memory.

An example process of the Operation 901 is the same as an example process of the Operation 701, and is not described herein again.

In Operation 902, in response to the data output command, boosting voltages on all word lines corresponding to each of the plurality of memory planes to pass voltages in a voltage boosting rate corresponding to each of the plurality of memory planes, to complete pre-charging of the plurality of memory planes, wherein the voltage boosting rate corresponding to the memory plane of which the data output sequence is the first is greater than an average boosting rate, or the voltage boosting rate corresponding to the memory plane of which the data output sequence is the first is equal to the average number, and a sum of the voltage boosting rates corresponding to the plurality of memory planes is less than a total average boosting rate configured by the memory, and the voltage boosting rate is controlled by charge pump cells.

After acquiring the data output command, the peripheral circuit performs operations of the pre-charge phase in response to the data output command. For example, after acquiring the data output command, the peripheral circuit immediately perform the operation of the pre-charge phase, so as to improve the efficiency of the data output operation.

In the examples of the present application, the operation of the pre-charge phase comprises: boosting voltages on all word lines corresponding to each of the plurality of memory planes to pass voltages in a voltage boosting rate corresponding to each of the plurality of memory planes. After the voltages on all the word lines corresponding to each of the plurality of memory planes are boosted to the pass voltages, the pre-charging of the plurality of memory planes is completed. The voltage boosting rate is controlled by the charge pump cells. For example, the voltage boosting rate corresponding to any one of the memory planes is positively correlated with the number of the charge pump cells corresponding to the any one of the memory planes, e.g., the magnitude of the voltage boosting rate corresponding to any one of the memory planes depends on the number of the charge pump cells corresponding to the any one of the memory planes, such that if there are more charge pump cells corresponding to any one of the memory planes, the voltage boosting rate corresponding to any one of the memory planes is larger.

In an example, using any one of the memory planes as an example for description, and the process of boosting voltages on all word lines corresponding to any one of the memory planes to pass voltages in a voltage boosting rate corresponding to the any one of the memory planes comprises: determining the voltage boosting rate corresponding to the any one of the memory planes; sending, by the peripheral circuit, a word line control signal corresponding to the any one of the memory planes to the voltage generator, wherein the word line control signal carries the voltage boosting rate corresponding to the any one of the memory planes; and analyzing, by the voltage generator, the word line control signal, and determining the voltage boosting rate corresponding to the any one of the memory planes, and boosting, by the voltage generator, voltages on all word lines corresponding to the any one of the memory planes to pass voltages in a voltage boosting rate corresponding to the any one of the memory planes.

In the examples of the present application, the plurality of memory planes correspond to the voltage boosting rates respectively, and the voltage boosting rates corresponding to the plurality of memory planes respectively meet either Constraint 1 or Constraint 2 below.

Constraint 1: the voltage boosting rate corresponding to the memory plane of which the data output sequence is the first is greater than an average boosting rate.

The average boosting rate is a voltage boosting rate that an average number of the charge pump cells can provide. The average number refers to a ratio of the total number of charge pump cells that have been configured in the memory to the number of the plurality of memory planes corresponding to the data output command.

When the voltage boosting rates corresponding to the plurality of memory planes respectively meet the Constraint 1, the word line corresponding to the memory plane of which data output sequence is the first can be boosted to the pass voltage more quickly, such that the data read and data output operations can be performed more quickly, so as to shorten the data output duration; and as the sum of the voltage boosting rates corresponding to the plurality of memory planes does not exceed a total voltage boosting rate configured by the memory, the power consumption consumed to boost the voltage on the word line is not increased. The total voltage boosting rate configured by the memory refers to a total boosting rate that all the charge pump cells that have been configured in the memory can provide.

It is to be noted that, when the Constraint 1 is met, the sum of the voltage boosting rates corresponding to the plurality of memory planes may be equal to the total voltage boosting rate configured by the memory, or may also be less than the total voltage boosting rate configured by the memory. If the sum of the voltage boosting rates corresponding to the plurality of memory planes is less than the total voltage boosting rate configured by the memory, when the Constraint 1 is met, the data output duration may be shortened, and the power consumption consumed to boost the voltage on the word line may also be reduced.

Constraint 2: the voltage boosting rate corresponding to the memory plane of which the data output sequence is the first is equal to the average number, and a sum of the voltage boosting rates corresponding to the plurality of memory planes is less than a total average boosting rate configured by the memory.

When the voltage boosting rates corresponding to the plurality of memory planes respectively meet the Constraint 2, although the voltage boosting rate corresponding to the memory plane of which the data output sequence is the first is equal to the average boosting rate, making the data output duration maintained unchanged, the sum of the voltage boosting rates corresponding to the plurality of memory planes is less than the total voltage boosting rate configured by the memory, such that the power consumption consumed to boost the voltage on the word line can be reduced.

In one possible example, on the basis of the voltage boosting rates corresponding to the plurality of memory planes respectively meeting the above-mentioned Constraint 1 or Constraint 2, the voltage boosting rates corresponding to the plurality of memory planes respectively further meet Constraint 3 below.

Constraint 3: the voltage boosting rate corresponding to any one of the plurality of memory planes is positively correlated with the data output sequence corresponding to the any one of the memory planes.

For example, the more forward the data output sequence corresponding to any one of the memory planes, the larger the voltage boosting rate corresponding to the any one of the memory planes. For example, if the plurality of memory planes comprise the first memory plane and the second memory plane, the data output sequence corresponding to the first memory plane is prior to the data output sequence corresponding to the second memory plane, and the voltage boosting rate corresponding to the first memory plane is greater than the voltage boosting rate corresponding to the second memory plane.

In one possible example, pre-charging start time corresponding to the first memory plane is the same as pre-charging start time corresponding to the second memory plane, for example, all the memory planes start to be pre-charged at the same time for conveniently control. Based on this, if the voltage boosting rate corresponding to any one of the plurality of memory planes is positively correlated with the data output sequence corresponding to the any one of the memory planes, the voltage boosting rate corresponding to the first memory plane is greater than the voltage boosting rate corresponding to the second memory plane, such that pre-charging end time corresponding to the first memory plane is earlier than pre-charging end time corresponding to the second memory plane. For example, all the memory planes start to be pre-charged at the same time, the more forward the data output sequence, the earlier the pre-charging of the memory planes is completed, so as to conveniently make the memory planes of which data output sequences are more forward perform the data read and data output operations earlier.

The more backward the data output sequence, the lower requirements of the memory plane for the data reading duration, e.g., the memory plane with the more backward data output sequence may utilize a longer data reading duration to read data, e.g., may utilize slower voltage boosting rates to boost the corresponding word lines to the pass voltages. Based on such example, a time difference between the time when data of the memory planes with different data output sequences is output can be fully utilized, such that the data output duration is further shortened, or on the basis of maintaining the data output duration unchanged, the power consumption consumed at the pre-charge phase is further reduced.

Before boosting voltages on all word lines corresponding to each of the plurality of memory planes to pass voltages in a voltage boosting rate corresponding to each of the plurality of memory planes, the voltage boosting rate corresponding to each of the plurality of memory planes needs to be first determined.

In one possible example, the process of determining the voltage boosting rate corresponding to each of the plurality of memory planes comprises: acquiring a correspondence relationship between the data output sequence and the voltage boosting rate; and determining the voltage boosting rate corresponding to each of the plurality of memory planes based on the data output sequence corresponding to each of the plurality of memory planes and the correspondence relationship.

The correspondence relationship between the data output sequence and the voltage boosting rate may be stored in the peripheral circuit (e.g., stored in the control logic unit), such that the peripheral circuit can directly extract the correspondence relationship between the data output sequence and the voltage boosting rate. In an example, the correspondence relationship between the data output sequence and the voltage boosting rate may be stored in the controller, and the peripheral circuit acquires the correspondence relationship between the data output sequence and the voltage boosting rate by interacting with the controller.

It is to be noted that, the correspondence relationship between the data output sequence and the voltage boosting rate may be acquired when the voltage boosting rate corresponding to each of the plurality of memory planes needs to be determined, e.g., after the data output command is acquired, or may also be acquired before the data output command is acquired, and the examples of the present application are not limited thereto.

After the correspondence relationship between the data output sequence and the voltage boosting rate is acquired, the voltage boosting rate corresponding to each of the plurality of memory planes may be determined according to the correspondence relationship between the data output sequence and the voltage boosting rate, such that the voltage boosting rate corresponding to each of the plurality of memory planes are determined.

In another possible example, the process of determining the voltage boosting rate corresponding to each of the plurality of memory planes comprises: determining the charge pump cells corresponding to each of the plurality of memory planes; and using the voltage boosting rate provided by the charge pump cell corresponding to any one of the memory planes as the voltage boosting rate corresponding to the any one of the memory planes. The process of determining the charge pump cells corresponding to each of the plurality of memory planes may refer to the examples shown in FIG. 7, and is not described herein again. The peripheral circuit may record the voltage boosting rate that can be provided by each of the charge pump cells in the memory, and after the charge pump cells corresponding to any one of the memory planes are determined, the voltage boosting rates that the charge pump cells corresponding to the any one of the memory planes can provide may further be determined.

In examples, the voltage boosting rates that different charge pump cells can provide are the same, for example, all are reference rates, then the number of the charge pump cells corresponding to each of the plurality of memory planes may be determined, and a product of the number of the charge pump cells corresponding to any one of the memory planes and the reference rate is used as the voltage boosting rate corresponding to the any one of the memory plane.

In Operation 903, for any one of the memory planes that has been pre-charged, reading data of the any one of the memory planes, and outputting the data of the any one of the memory planes according to the data output sequence corresponding to the any one of the memory planes, wherein, when the data output sequence corresponding to the any one of the memory planes is the first, read completion time corresponding to the any one of the memory planes is the same as output start time corresponding to the any one of the memory planes.

In examples, when the data output sequence corresponding to any one of the memory planes is not the first, the read completion time corresponding to any one of the memory planes is not later than the output start time corresponding to the any one of the memory planes.

An example process of the Operation 903 is the same as an example process of the Operation 703, and is not described herein again.

From the overall process of the data output operations of the plurality of memory planes, the data of the plurality of memory planes are output in sequence according to the data output sequences corresponding to each of the plurality of memory planes. For example, the output start time corresponding to the memory plane of which data output sequence is the $N^{th}$ is not earlier than the output completion time corresponding to the memory plane of which data output sequence is the $N-1^{th}$, wherein N is an integer greater than 1. The output completion time corresponding to any one of the memory planes refers to the time when the data of the any one of the memory planes has been completely output.

In examples, output start time corresponding to the memory plane of which the data output sequence is the $N^{th}$ is the same as output completion time corresponding to the memory plane of which the data output sequence is the $N-1^{th}$, wherein N is an integer greater than 1. For example, after the data of the memory plane of which data output sequence is the $N-1^{th}$ has been completely output, the data of the memory plane of which data output sequence is the $N^{th}$ starts to be immediately (e.g., no interruption in time) output. In this way, the data of the plurality of memory planes can be guaranteed to be output without interruption, an overall output duration of the data of all the memory planes is shortened, and the operation performance of the data output operations of the plurality of memory planes is improved.

In the technical solutions provided by the examples of the present application, if the voltage boosting rate corresponding to the memory plane of which data output sequence is the first is greater than the average rate, the word line corresponding to the memory plane of which data output sequence is the first can be boosted to the pass voltage more quickly, such that the data read and data output operations can be performed more quickly, so as to shorten the data output duration; and as the sum of the voltage boosting rates corresponding to the plurality of memory planes does not exceed a total voltage boosting rate configured by the memory, the power consumption consumed to boost the voltage on the word line is not increased.

If the voltage boosting rate corresponding to the memory plane of which data output sequence is the first is equal to the average boosting rate, although the data output duration maintains unchanged, the sum of the voltage boosting rates corresponding to the plurality of memory planes is less than the total voltage boosting rate configured by the memory, such that the power consumption consumed to boost the voltage on the word line can be reduced.

According to the above-mentioned analysis, it can be learned that, in the technical solutions provided by the examples of the present application, the data output duration can be shortened without increasing power consumption, or power consumption can be reduced on the basis of maintaining the data output duration unchanged, such that the overall operation performance of data output operations of a plurality of memory planes can be improved.

In an example, during the data output operation of the plurality of memory planes, for any one of the memory planes, in the process of pre-charging the any one of the memory planes, in addition to the operation of boosting the voltages on all the word lines (selected word lines and non-selected word lines) corresponding to the any one of the memory planes to the pass voltages (Vpass), an operation of boosting gate voltages of a selected TSG, a selected BSG, a non-selected TSG, and a non-selected BSG of the any one of the memory planes to the pass voltages (Vpass) is also involved. The voltage boosting rate to boost the gate voltages of the selected TSG, the selected BSG, the non-selected TSG, and the non-selected BSG of the any one of the memory planes to the pass voltages (Vpass) is the same as the voltage boosting rate to boost the voltages on the word lines corresponding to the any one of the memory planes to the pass voltages. The pass voltage corresponding to the TSG is used for turning on the TSG, the pass voltage corresponding to the BSG is used for turning on the BSG, and the pass voltages corresponding to the TSG, the BSG, and the word lines may be the same or different.

The selected TSG and the selected BSG are TSG and BSG in a selected memory string, and the non-selected TSG and the non-selected BSG are TSG and BSG in a non-selected memory string, wherein the selected memory string refers to the memory string where the memory cell (selected memory cell), in which the data needs to be read, in the memory cell layer coupled with the selected word line is located; and the non-selected memory string refers to the memory string where the memory cell (non-selected memory cell), in which the data does not need to be read, in the memory cell layer coupled with the selected word line is located.

Before any one of the memory planes is pre-charged, a lower voltage is applied to gates of the selected TSG, selected BSG, non-selected TSG, and non-selected BSG corresponding to the any one of the memory planes, and the lower voltage is used for turning off the selected TSG, the selected BSG, the non-selected TSG, and the non-selected BSG, for example, the lower voltage may be Vss (ground voltage). A lower voltage is applied to the word lines corresponding to the any one of the memory planes, and the lower voltage is used for turning off the memory cells coupled with the word lines, for example, the lower voltage may be Vdd (working voltage).

After any one of the memory planes is pre-charged, during the process of reading the data of the any one of the memory planes, in addition to adjusting the voltage on the selected word line corresponding to the any one of the memory planes from the pass voltage to the read voltage (Vrd), the voltage on the gate of the non-selected TSG corresponding to the any one of the memory planes is also adjusted from the pass voltage to a lower voltage (e.g., Vss).

After the data of the any one of the memory planes has been read, the voltage on the selected word line and the gate voltage of the non-selected TSG corresponding to the any one of the memory planes are adjusted to the pass voltage. Then, at a specified time, the voltage on the word line, the gate voltage of the TSG, the gate voltage on the BSG, and the like are all recovered to the voltages before pre-charging. The specified time may be set according to experience, or may also be flexibly adjusted according to read requirements, and the examples of the present application are not limited thereto. For example, the specified time may refer to the output completion time corresponding to the any one of the memory planes, or may also refer to the time when the data of all the memory planes has been output, and so on.

Figure 10:
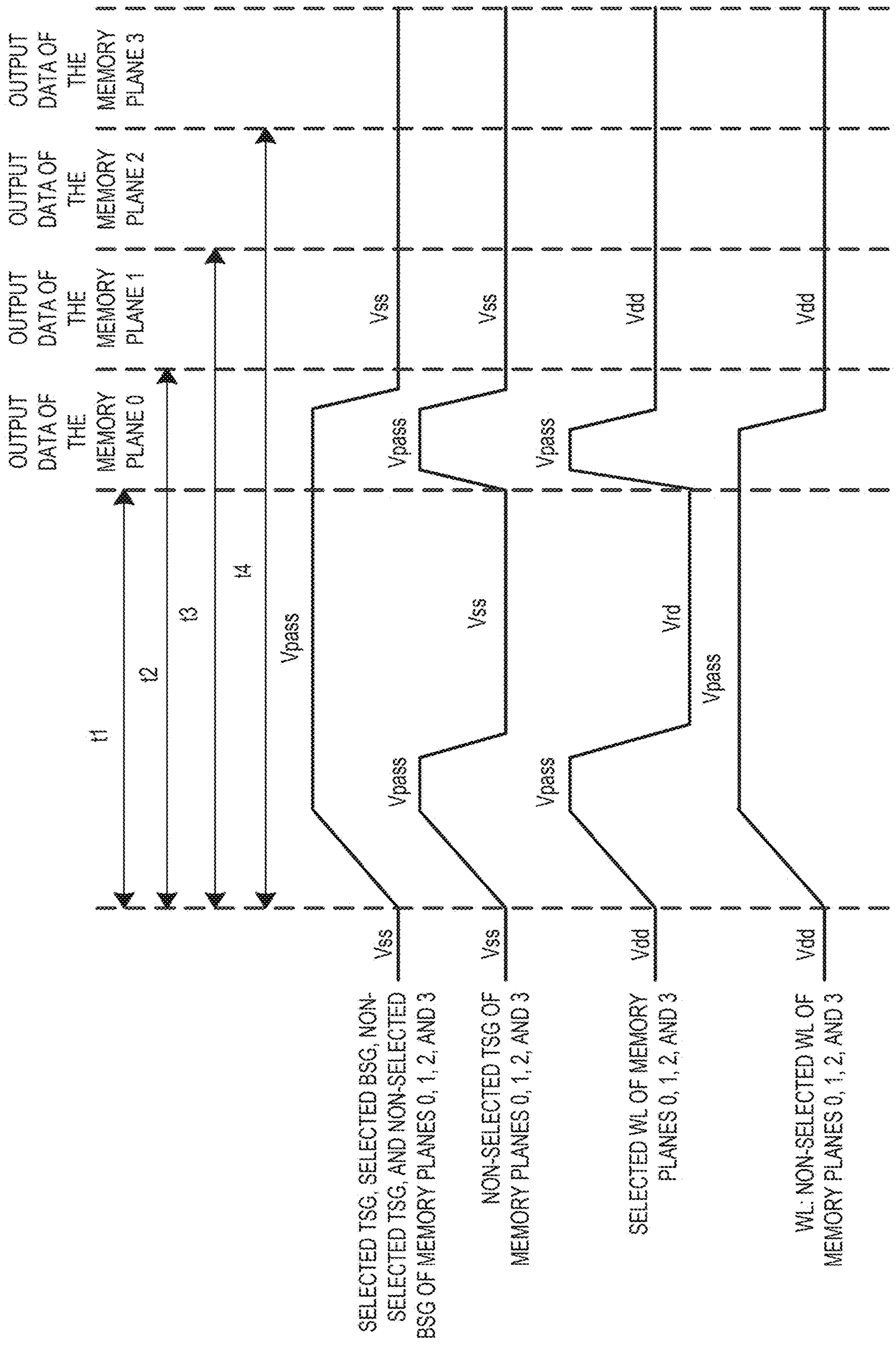
FIG. 10 is a timing diagram of voltages of data output operations corresponding to a plurality of memory planes provided by an example.
Figure 11A:
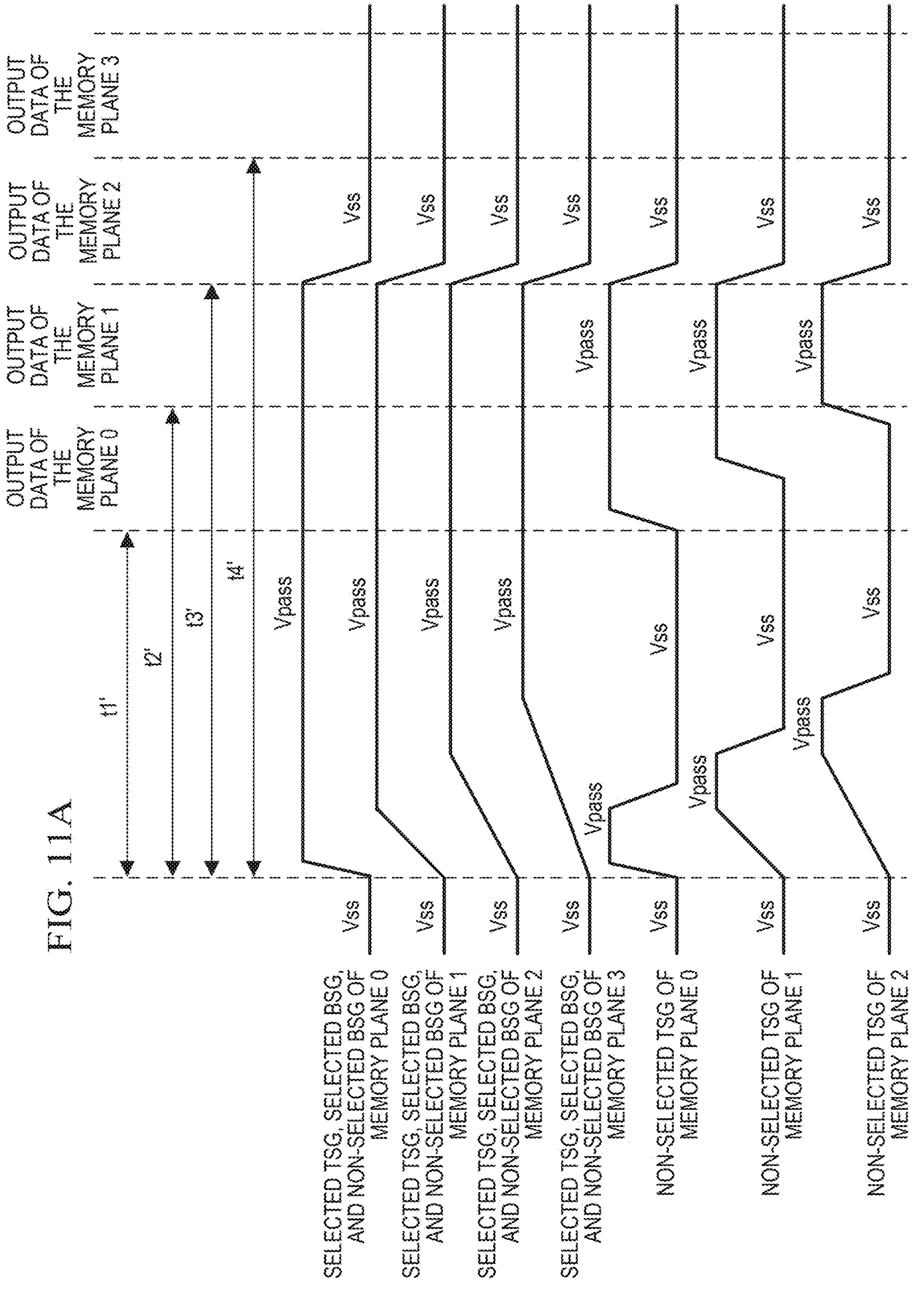
FIGS. 11A and 11B (which may be collectively referred to herein as FIG. 11) are a timing diagram of voltages of data output operations corresponding to a plurality of memory planes provided by examples of the present application.
Figure 11B:
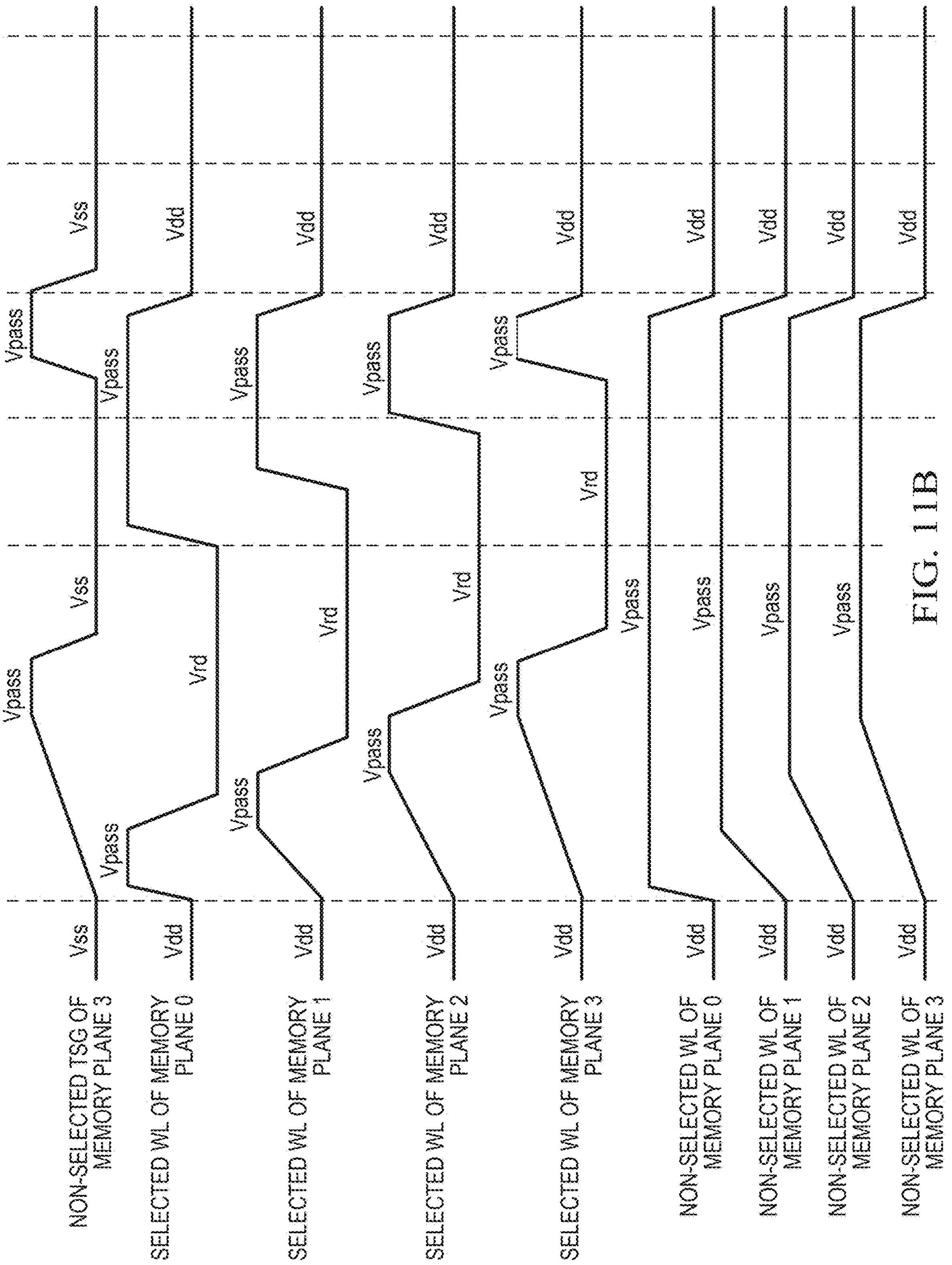

Next, using the type of the memory cell being an SLC as an example, in combination with a timing diagram of voltages corresponding to the data output operations corresponding to the plurality of memory planes in one example shown in FIG. 10, as well as a timing diagram of voltages corresponding to the data output operations corresponding to the plurality of memory planes in the examples of the present application shown in FIG. 11, one example is compared with the examples of the present application.

As shown in FIG. 10, based on the method provided by one example, using the data output operations of 4 memory planes as an example, 12 charge pump cells are evenly allocated to the 4 memory planes. In order to balance the impact on the peak current of the memory during word line charging, the voltage boosting rate of the word line needs to be controlled; and after the charge pump cells are evenly allocated, the boosting rates of the voltages on the word lines corresponding to the 4 memory planes are the same, e.g., the pre-charging durations corresponding to the 4 memory planes are the same. The read start time and read completion time of data of the 4 memory planes is also the same.

Using the data of the memory plane 0, the memory plane 1, the memory plane 2, and the memory plane 3 being output in sequence as an example, the data of the memory plane 0 is output first, the data of the memory plane 1 can be output only after the data of the memory plane 0 has been output completely, the data of the memory plane 2 can be output only after the data of the memory plane 0 and memory plane 1 has been output completely, and the data of the memory plane 3 can be output only after the data of the memory plane 0, memory plane 1, and memory plane 2 has been output completely. For the memory plane 1, a duration (e.g., a duration between the read completion time and the output start time of the data) wasted is t2−t1; for the memory plane 2, a duration (e.g., a duration between the read completion time and the output start time of the data) wasted is t3−t1; and for the memory plane 3, a duration (e.g., a duration between the read completion time and the output start time of the data) wasted is t4−t1. For example, even if one memory plane has completed the data reading operation, the data output operation of the memory plane can be performed only after the data of the previous memory plane has been output completely.

t1 is the time when the data of the memory plane 0 starts to be output; t2 is the time when the data of the memory plane 0 has been output completely and when the data of the memory plane 1 starts to be output; t3 is the time when the data of the memory plane 1 has been output completely and when the data of the memory plane 2 starts to be output; and t4 is the time when the data of the memory plane 2 has been output completely and when the data of the memory plane 3 starts to be output.

According to the above-mentioned analysis, it can be learned that, utilizing the method provided by one example to perform the data output operations of the plurality of memory planes may cause the memory planes with more backward output sequences to waste more time, thus the data output duration cannot be effectively prolonged, and since all the charge pump cells are inevitably utilized for pre-charging, the power consumption is relatively large.

As shown in FIG. 11, based on the method provided by the examples of the present application, the memory planes with more forward data output sequences are allocated with more charge pump cells, e.g., at the pre-charge phase, the boosting rates of the voltages on the word lines corresponding to the memory planes with more forward data output sequences are larger, e.g., in FIG. 11, a slope for boosting the voltages of the word lines (selected word lines and non-selected word lines) from Vss to Vpass is larger. In particular, the data output sequences of the memory plane 0, the memory plane 1, the memory plane 2, and the memory plane 3 are arranged in sequence. A slope for boosting the voltages of the word line corresponding to the memory plane 0 from Vss to Vpass is greater than a slope for boosting the voltages of the word line corresponding to the memory plane 1 from Vss to Vpass; a slope for boosting the voltages of the word line corresponding to the memory plane 1 from Vss to Vpass is greater than a slope for boosting the voltages of the word line corresponding to the memory plane 2 from Vss to Vpass; and a slope for boosting the voltages of the word line corresponding to the memory plane 2 from Vss to Vpass is greater than a slope for boosting the voltages of the word line corresponding to the memory plane 3 from Vss to Vpass.

In FIG. 11, t1' is the time when the data of the memory plane 0 starts to be output; t2' is the time when the data of the memory plane 0 has been output completely and when the data of the memory plane 1 starts to be output; t3' is the time when the data of the memory plane 1 has been output completely and when the data of the memory plane 2 starts to be output; and t4' is the time when the data of the memory plane 2 has been output completely and when the data of the memory plane 3 starts to be output. By reusing the duration when the data of the memory plane 0 is output, the pre-charging duration of the memory plane 1 is prolonged, the charging of the word line of the memory plane 1 may be slowed down, the charged charge pump cells are allocated to the memory plane 0, and the word line corresponding to the memory plane 0 can be charged more quickly and data can be read more quickly, achieving t1'<t1, such that the duration when the data of the memory plane 0 is output is shortened, thereby shortening the data output duration of the overall operation.

It is to be noted that, in order to implement the examples of the present application, the peripheral circuit needs to determine, through a logical operation, the charge pump cells corresponding to each memory plane in advance, and also needs to determine the data output sequence of each memory plane according to a data output command of a host. Furthermore, since data of different memory planes start to be read at different time points, an individual sequence is also required to record start reading time of each memory plane, so as to compensate the impact of different start reading times due to different pre-charging durations.

Compared with the method of one example, the method provided by the examples of the present application changes a voltage timing waveform during word line charging. In particular, during the process of outputting the data of the plurality of memory planes, the voltage boosting rates corresponding to word lines of the plurality of memory planes at the pre-charge phase change from the same rate to a rate that is positively correlated with the data output sequence. By simply controlling the voltage timing waveform, the data output duration of the plurality of memory planes may be improved.

Based on the method provided by the examples of the present application, with a relatively sufficient area of the charge pump circuit, by utilizing the time difference of data output, the data output duration can be shortened by dynamically adjusting an allocation mode of the charge pump cells, and with limited area of the charge pump circuit, the charge pump area can also be reduced through the time difference between when the data is output. Through rough estimation, for the data output operations of 4 memory planes, in order to realize the same data output duration, the area of the charge pump circuit required to be utilized by the examples of the present application is ⅓-¼ of the area of the charge pump circuit required to be utilized by the above example.

Examples of the present application provide a memory. The memory may be shown in FIG. 4. The memory comprises:

- a memory array comprising a plurality of memory planes;
- a plurality of word lines coupled with memory cells in the plurality of memory planes; and
- a peripheral circuit coupled with the plurality of word lines, wherein the peripheral circuit is configured to perform the operation method of the memory in the example shown in FIG. 7 or FIG. 9.

The descriptions about the memory-related hardware examples have beneficial effects similar to those of the method examples. Technical details undisclosed in the memory-related hardware examples are understood with reference to the descriptions about the method examples of the present application.

Figure 12:
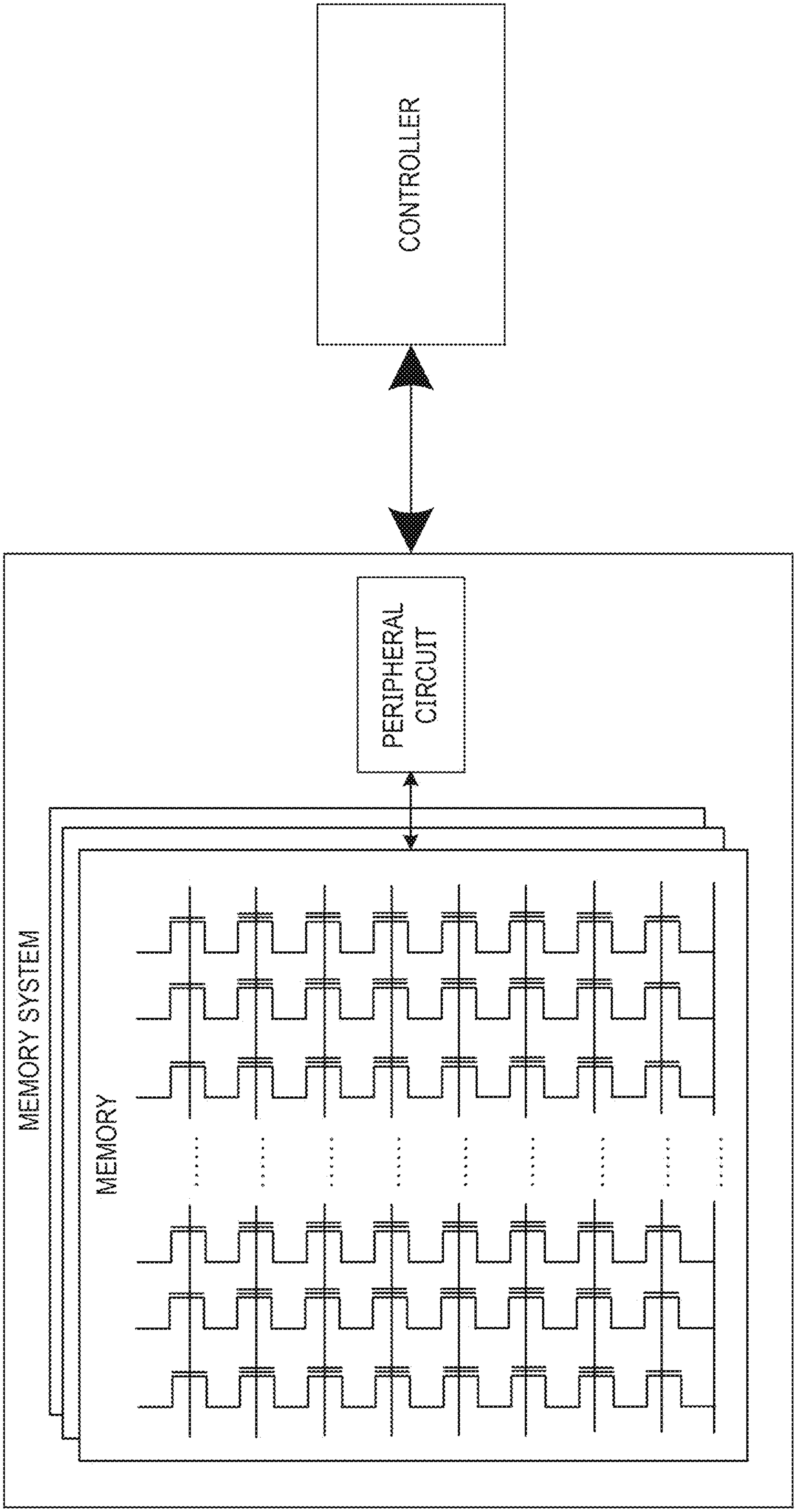
FIG. 12 is a schematic structural diagram of a memory system provided by examples of the present application.

Examples of the present application provide a memory system. The memory system may be shown in FIG. 12. The memory system comprises a memory and a controller coupled with the memory, wherein the controller is configured to control the memory;

the controller is configured to: acquire a data output command, and send the data output command to the memory, wherein the data output command carries a data output sequence corresponding to each of a plurality of memory planes in the memory;

the memory is configured to: perform the operation method of the memory in the example shown in FIG. 7 or FIG. 9, so as to output data of any one of the memory planes to the controller; and the controller is configured to: receive the data of the any one of the memory planes.

The descriptions about the memory system-related hardware examples have beneficial effects similar to those of the method examples. Technical details undisclosed in the memory-related hardware examples are understood with reference to the descriptions about the method examples of the present application.

Examples of the present application provide an electronic system. The electronic system comprises a host and the memory system described in any one of the above. In an example, the electronic system may be shown in FIG. 1.

The memory system comprises a memory and a controller coupled with the memory; the controller is configured to control the memory; the host is provided with a first interface, and the controller is provided with a second interface; the host and the memory system are coupled through the first interface and the second interface to achieve information interaction;

the host is configured to: send data output command to the controller through the first interface, wherein the data output command carries a data output sequence corresponding to each of a plurality of memory planes in the memory;

the controller is configured to receive the data output command through the second interface, and send the data output command to the memory;

the memory is configured to: perform the operation method of the memory in the example shown in FIG. 7 or FIG. 9, so as to output data of any one of the memory planes to the controller;

the controller is further configured to: receive the data of any one of the memory planes, and output the data of the any one of the memory planes to the host through the second interface; and the host is configured to: receive the data of any one of the memory planes through the first interface.

The descriptions about the electronic system-related hardware examples have beneficial effects similar to those of the method examples. Technical details undisclosed in the memory-related hardware examples are understood with reference to the descriptions about the method examples of the present application.

It should be understood that "a plurality of" mentioned here refers to two or more. The term "at least one of" is an association relationship describing related objects, which means that there may be three relationships, for example, at least one of A or B may indicate three cases: A exists alone, A and B exist simultaneously, and B exists alone. The character "/" in this paper indicates that the related objects are in an "or" relationship.

The above are only examples of the present application and are not used to limit the present application. Any modifications, equivalent replacements and improvements and the like made within the principle of the disclosure shall be included within the scope of protection of the present application.

What is claimed is:

1. An operation method of a memory, comprising:

acquiring a data output command, wherein the data output command carries a data output sequence corresponding to each of a plurality of memory planes in the memory;

in response to the data output command, utilizing charge pump cells corresponding to each of the plurality of memory planes to boost voltages on all word lines corresponding to each of the plurality of memory planes to pass voltages to complete pre-charging of the plurality of memory planes, wherein either:

a number of the charge pump cells corresponding to the memory plane of which the data output sequence is a first sequence is greater than an average number, wherein the average number is a ratio of a total number of charge pump cells that have been configured in the memory to a number of the plurality of memory planes; or the number of the charge pump cells corresponding to the memory plane of which the data output sequence is the first sequence is equal to the average number, and wherein a total number of the charge pump cells corresponding to the plurality of memory planes is less than the total number of charge pump cells that have been configured in the memory; and for any one of the memory planes that has been pre-charged:

reading data of the any one of the memory planes; and outputting the data of the any one of the memory planes according to the data output sequence corresponding to the any one of the memory planes, wherein when the data output sequence corresponding to the any one of the memory planes is the first sequence, read completion time corresponding to the any one of the memory planes is the same as output start time corresponding to the any one of the memory planes.

2. The method of claim 1, wherein the number of the charge pump cells corresponding to any one of the plurality of memory planes is positively correlated with the data output sequence corresponding to the any one of the memory planes.

3. The method of claim 2, wherein the number of the charge pump cells corresponding to a first memory plane is greater than the number of the charge pump cells corresponding to a second memory plane, and wherein the data output sequence corresponding to the first memory plane is prior to the data output sequence corresponding to the second memory plane.

4. The method of claim 1, further comprising:

acquiring a first correspondence relationship, wherein the first correspondence relationship indicates a correspondence relationship between the data output sequence and the charge pump cells; and determining the charge pump cells corresponding to each of the plurality of memory planes based on the data output sequence corresponding to each of the plurality of memory planes and the first correspondence relationship.

5. The method of claim 1, further comprising:

acquiring a second correspondence relationship, wherein the second correspondence relationship indicates a correspondence relationship between the data output sequence and the number of the charge pump cells;

determining the charge pump cells corresponding to each of the plurality of memory planes based on the data output sequence corresponding to each of the plurality of memory planes and the second correspondence relationship; and determining the charge pump cells corresponding to each of the plurality of memory planes from the charge pump cells that have been configured in the memory based on the number of the charge pump cells corresponding to each of the plurality of memory planes.

6. The method of claim 1, wherein reading data of the any one of the memory planes comprises:

adjusting a voltage on a selected word line among all the word lines corresponding to the any one of the memory planes from the pass voltage to a read voltage; and reading, based the read voltage, data to be read in the any one of the memory planes.

7. The method of claim 1, wherein the maximum value of respective instantaneous currents generated during a pre-charging process of the plurality of memory planes is not greater than a current threshold.

8. The method of claim 1, wherein acquiring the data output command comprises receiving the data output command sent by a controller.

9. An operation method of a memory, comprising:

acquiring a data output command, wherein the data output command carries a data output sequence corresponding to each of a plurality of memory planes in the memory;

in response to the data output command, boosting voltages on all word lines corresponding to each of the plurality of memory planes to pass voltages in a voltage boosting rate corresponding to each of the plurality of memory planes to complete pre-charging of the plurality of memory planes, wherein either:

the voltage boosting rate corresponding to the memory plane of which the data output sequence is a first sequence is greater than an average number, wherein the average number is a ratio of a total number of charge pump cells that have been configured in the memory to a number of the plurality of memory planes; or the voltage boosting rate corresponding to the memory plane of which the data output sequence is the first sequence is equal to the average number, and wherein a sum of the voltage boosting rates corresponding to the plurality of memory planes is less than a total average boosting rate configured by the memory, and wherein the voltage boosting rate is controlled by the charge pump cells; and for any one of the memory planes that has been pre-charged:

reading data of the any one of the memory planes; and outputting the data of the any one of the memory planes according to the data output sequence corresponding to the any one of the memory planes, wherein when the data output sequence corresponding to the any one of the memory planes is the first sequence, read completion time corresponding to the any one of the memory planes is the same as output start time corresponding to the any one of the memory planes.

10. The method of claim 9, wherein the voltage boosting rate corresponding to any one of the plurality of memory planes is positively correlated with the data output sequence corresponding to the any one of the memory planes.

11. The method of claim 10, wherein the voltage boosting rate corresponding to a first memory plane is greater than the voltage boosting rate corresponding to a second memory plane, and wherein the data output sequence corresponding to the first memory plane is prior to the data output sequence corresponding to the second memory plane.

12. The method of claim 10, wherein a pre-charging start time corresponding to a first memory plane is the same as a pre-charging start time corresponding to a second memory plane, wherein a pre-charging end time corresponding to the first memory plane is earlier than a pre-charging end time corresponding to the second memory plane, and wherein the data output sequence corresponding to the first memory plane is prior to the data output sequence corresponding to the second memory plane.

13. The method of claim 9, further comprising:

acquiring a correspondence relationship between the data output sequence and the voltage boosting rate; and determining the voltage boosting rate corresponding to each of the plurality of memory planes based on the data output sequence corresponding to each of the plurality of memory planes and the correspondence relationship.

14. The method of claim 9, wherein the output start time corresponding to the memory plane of which the data output sequence is an $N^{th}$ is the same as an output completion time corresponding to the memory plane of which the data output sequence is an $N-1^{th}$, wherein N is an integer greater than 1.

15. The method of claim 9, wherein when the data output sequence corresponding to the any one of the memory planes is not the first sequence, the read completion time corresponding to the any one of the memory planes is not later than the output start time corresponding to the any one of the memory planes.

16. A memory, comprising:

a memory array comprising a plurality of memory planes;

a plurality of word lines coupled with memory cells in the plurality of memory planes; and a peripheral circuit coupled with the plurality of word lines, wherein the peripheral circuit is configured to perform an operation method of the memory, wherein the method comprises:

acquiring a data output command, wherein the data output command carries a data output sequence corresponding to each of a plurality of memory planes in a memory;

in response to the data output command, utilizing charge pump cells corresponding to each of the plurality of memory planes to boost voltages on all word lines corresponding to each of the plurality of memory planes to pass voltages to complete pre-charging of the plurality of memory planes, wherein either:

a number of the charge pump cells corresponding to the memory plane of which the data output sequence is a first sequence is greater than an average number, wherein the average number is a ratio of a total number of charge pump cells that have been configured in the memory to a number of the plurality of memory planes; or the number of the charge pump cells corresponding to the memory plane of which the data output sequence is the first sequence is equal to the average number, and wherein a total number of the charge pump cells corresponding to the plurality of memory planes is less than the total number of charge pump cells that have been configured in the memory; and for any one of the memory planes that has been pre-charged:

reading data of the any one of the memory planes; and outputting the data of the any one of the memory planes according to the data output sequence corresponding to the any one of the memory planes, wherein when the data output sequence corresponding to the any one of the memory planes is the first sequence, read completion time corresponding to the any one of the memory planes is the same as output start time corresponding to the any one of the memory planes.

17. The memory of claim 16, wherein the number of the charge pump cells corresponding to any one of the plurality of memory planes is positively correlated with the data output sequence corresponding to the any one of the memory planes.

18. The memory of claim 17, wherein the number of the charge pump cells corresponding to a first memory plane is greater than the number of the charge pump cells corresponding to a second memory plane, and wherein the data output sequence corresponding to the first memory plane is prior to the data output sequence corresponding to the second memory plane.

19. The memory of claim 16, wherein the operation method further comprises:

acquiring a first correspondence relationship, wherein the first correspondence relationship indicates a correspondence relationship between the data output sequence and the charge pump cells; and determining the charge pump cells corresponding to each of the plurality of memory planes based on the data output sequence corresponding to each of the plurality of memory planes and the first correspondence relationship.

20. The memory of claim 16, wherein the operation method further comprises:

acquiring a second correspondence relationship, wherein the second correspondence relationship indicates a correspondence relationship between the data output sequence and the number of the charge pump cells;

determining the charge pump cells corresponding to each of the plurality of memory planes based on the data output sequence corresponding to each of the plurality of memory planes and the second correspondence relationship; and determining the charge pump cells corresponding to each of the plurality of memory planes from the charge pump cells that have been configured in the memory based on the number of the charge pump cells corresponding to each of the plurality of memory planes.

* * * * *